United States Patent
Manassen et al.

(10) Patent No.: US 12,066,322 B2
(45) Date of Patent: Aug. 20, 2024

(54) SINGLE GRAB OVERLAY MEASUREMENT OF TALL TARGETS

(71) Applicant: KLA Corporation, Milpitas, CA (US)

(72) Inventors: Amnon Manassen, Haifa (IL); Andrew V. Hill, Berkeley, CA (US); Yonatan Vaknin, Yoqneam Llit (IL); Avner Safrani, Misgav (IL)

(73) Assignee: KLA Corporation, Milpitas, CA (US)

( * ) Notice: Subject to any disclaimer, the term of this patent is extended or adjusted under 35 U.S.C. 154(b) by 93 days.

(21) Appl. No.: 17/986,592

(22) Filed: Nov. 14, 2022

(65) Prior Publication Data

US 2024/0159585 A1 May 16, 2024

(51) Int. Cl.
*G01J 1/04* (2006.01)
*G03F 7/00* (2006.01)

(52) U.S. Cl.
CPC ........ *G01J 1/0407* (2013.01); *G03F 7/70316* (2013.01)

(58) Field of Classification Search
CPC ............................ G01J 1/0407; G03F 7/70316
See application file for complete search history.

(56) References Cited

U.S. PATENT DOCUMENTS

| | | |
|---|---|---|
| 6,716,646 B1 | 4/2004 | Wright et al. |
| 11,164,307 B1 * | 11/2021 | Feler ................. G06T 7/001 |
| 2003/0058454 A1 | 3/2003 | Scheiner |
| 2021/0003928 A1 | 1/2021 | Den Boef et al. |
| 2021/0372784 A1 | 12/2021 | Hill et al. |
| 2022/0357674 A1 | 11/2022 | Hill et al. |

OTHER PUBLICATIONS

Korean Intellectual Property Office, International Search Report and Written Opinion received in International Application No. PCT/US2023/036935, Feb. 29, 2024, 8 pages.

* cited by examiner

*Primary Examiner* — David P Porta
*Assistant Examiner* — Fani Polyzos Boosalis
(74) *Attorney, Agent, or Firm* — Sulter Swantz IP

(57) ABSTRACT

An overlay metrology system may include an objective lens, illumination optics to illuminate an overlay target including a first grating with a first pitch on a first sample layer and a second grating with a second pitch on a second sample layer, where the first and second sample layers are separated by a layer separation distance greater than a depth of field of the objective lens. The system may further include collection optics with a radially-varying defocus distribution to compensate for the layer separation distance such that the first and second gratings are simultaneously in focus on the detector.

40 Claims, 16 Drawing Sheets

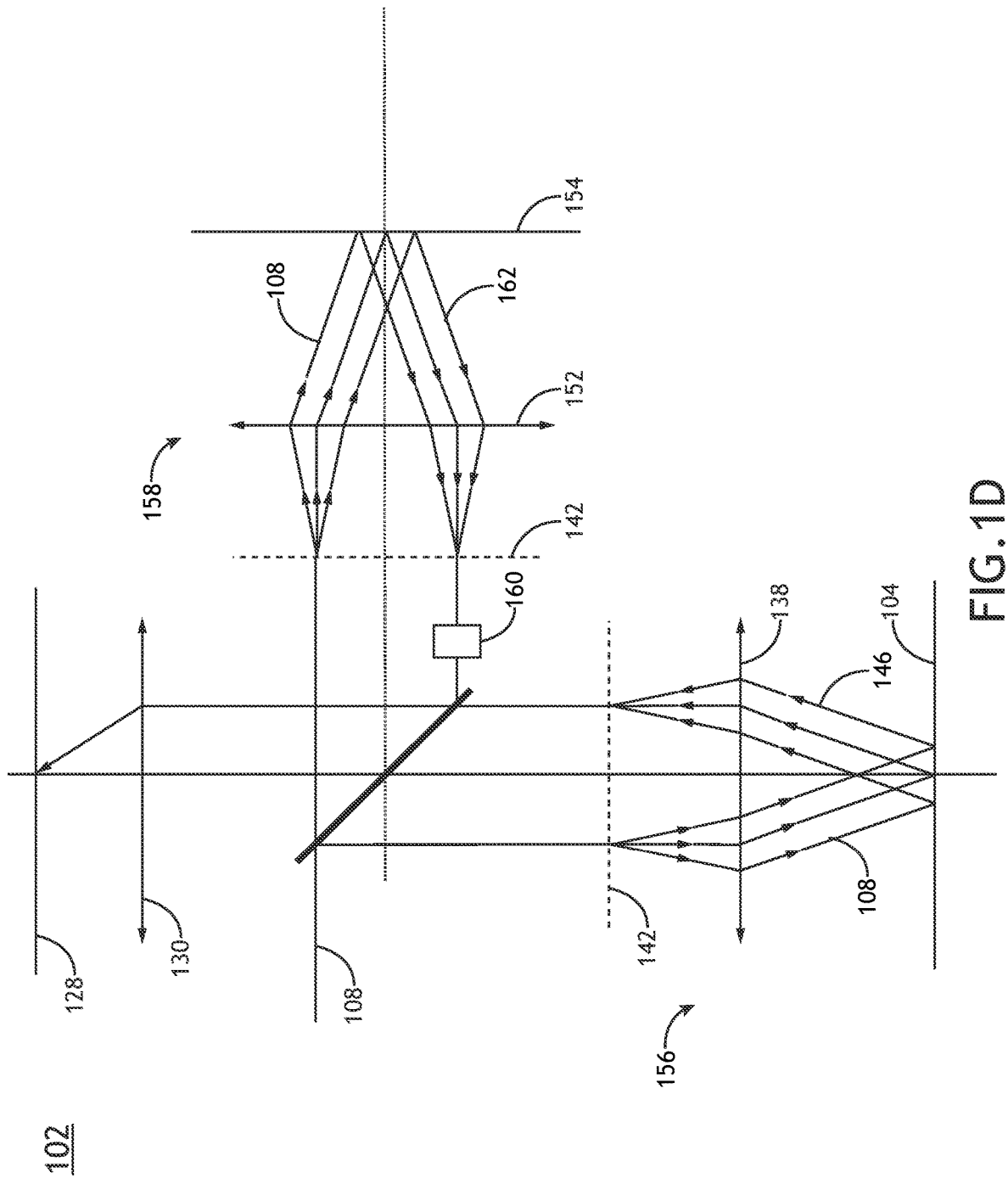

SINGLE GRAB OVERLAY MEASUREMENT OF TALL TARGETS

TECHNICAL FIELD

The present disclosure relates generally to overlay metrology and, more particularly, to overlay metrology on overlay targets having features with relatively large axial separation.

BACKGROUND

Advanced packaging schemes for semiconductor devices are increasingly utilizing three-dimensional (3D) fabrication techniques such as die-to-wafer (D2 W) or wafer-to-wafer (W2 W) processing in order to support aggressive roadmaps for connection-density and data transfer rates. Such techniques may dictate decreasing bond-sizes which may shrink the allowable space on a sample dedicated to overlay measurements despite simultaneous demands for tighter overlay tolerances and high measurement throughput. Further, 3D fabrication techniques may require registration measurements between features with relatively large axial separations (e.g., on the order of 100's of microns or greater). There is therefore a need to develop systems and methods to address these challenges.

SUMMARY

An overlay metrology system is disclosed in accordance with one or more illustrative embodiments of the present disclosure. In one illustrative embodiment, the system includes an objective lens. In another illustrative embodiment, the system includes one or more illumination optics configured to direct illumination from an illumination source to an overlay target on a sample through the objective lens when implementing a metrology recipe, where the overlay target in accordance with the metrology recipe includes a first grating with a first pitch on a first sample layer and a second grating with a second pitch on a second sample layer, and where the second pitch is smaller than the first pitch, wherein the first and second sample layers are separated by a layer separation distance greater than a depth of field of the objective lens. In another illustrative embodiment, the system includes a detector. In another illustrative embodiment, the system includes one or more collection optics configured to direct at least a portion of light collected by the objective lens to the detector, where the metrology recipe provides that diffraction orders of the illumination by the first grating collected by the objective lens are positioned below a threshold radius in a pupil plane and diffraction orders of the illumination by the second grating collected by the objective lens are positioned above the threshold radius in the pupil plane. In another illustrative embodiment, the one or more collection optics provide a radially-varying defocus distribution to compensate for the layer separation distance, where the first and second gratings are simultaneously in focus on the detector. In another illustrative embodiment, the system includes a controller. In another illustrative embodiment, the controller receives one or more images of the overlay target from the detector in which the first and second gratings are simultaneously in focus on the detector. In another illustrative embodiment, the controller determines an overlay measurement between the first and second layers of the sample based on the one or more images.

An overlay metrology system is disclosed in accordance with one or more illustrative embodiments of the present disclosure. In one illustrative embodiment, the system includes a controller communicatively coupled with an overlay metrology sub-system. In another illustrative embodiment, the controller receives one or more images of an overlay target from a detector of the overlay metrology sub-system in which the first and second gratings are simultaneously in focus on the detector. In another illustrative embodiment, the overlay metrology sub-system includes an objective lens. In another illustrative embodiment, In another illustrative embodiment, the overlay metrology sub-system includes one or more illumination optics configured to direct illumination from an illumination source to the overlay target on a sample through the objective lens when implementing the metrology recipe, where the overlay target in accordance with the metrology recipe includes a first grating with a first pitch on a first sample layer and a second grating with a second pitch on a second sample layer, and where the second pitch is smaller than the first pitch, wherein the first and second sample layers are separated by a layer separation distance greater than a depth of field of the objective lens. In another illustrative embodiment, the overlay metrology sub-system includes a detector. In another illustrative embodiment, the overlay metrology sub-system includes one or more collection optics configured to direct at least a portion of light collected by the objective lens to the detector, where the metrology recipe provides that diffraction orders of the illumination by the first grating collected by the objective lens are positioned below a threshold radius in a pupil plane and diffraction orders of the illumination by the second grating collected by the objective lens are positioned above the threshold radius in the pupil plane. In another illustrative embodiment, the one or more collection optics provide a radially-varying defocus distribution to compensate for the layer separation distance, wherein the first and second gratings are simultaneously in focus on the detector. In another illustrative embodiment, the controller determines an overlay measurement between the first and second layers of the sample based on the one or more images.

An overlay metrology method is disclosed in accordance with one or more illustrative embodiments of the present disclosure. In one illustrative embodiment, the method includes receiving one or more images of an overlay target on a sample from a detector of an overlay metrology sub-system, where the overlay target in accordance with a metrology recipe includes a first grating with a first pitch on a first sample layer and a second grating with a second pitch on a second sample layer, and where the second pitch is smaller than the first pitch. In another illustrative embodiment, the first and second gratings are simultaneously in focus on the detector. In another illustrative embodiment, the overlay metrology sub-system includes an objective lens. In another illustrative embodiment, the overlay metrology sub-system includes one or more illumination optics configured to direct illumination from an illumination source to the overlay target on the sample through the objective lens when implementing the metrology recipe, where the first and second sample layers are separated by a layer separation distance greater than a depth of field of the objective lens. In another illustrative embodiment, the overlay metrology sub-system includes a detector. In another illustrative embodiment, the overlay metrology sub-system includes one or more collection optics configured to direct at least a portion of light collected by the objective lens to the detector, where the metrology recipe provides that diffraction orders of the illumination by the first grating collected by the objective lens are positioned below a threshold radius in a pupil plane and diffraction orders of the illumination by the second grating collected by the objective lens are positioned above the threshold radius in the pupil plane. In another illustrative embodiment, the one or more collection optics provide a radially-varying defocus distribution to compensate for the layer separation distance, wherein the first and second gratings are simultaneously in focus on the detector. In another illustrative embodiment, the method includes determining an overlay measurement between the first and second layers of the sample based on the one or more images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 1D is a conceptual view of an overlay metrology sub-system including a Linnik interferometer, in accordance with one or more embodiments of the present disclosure.

DETAILED DESCRIPTION

Figure 1A:
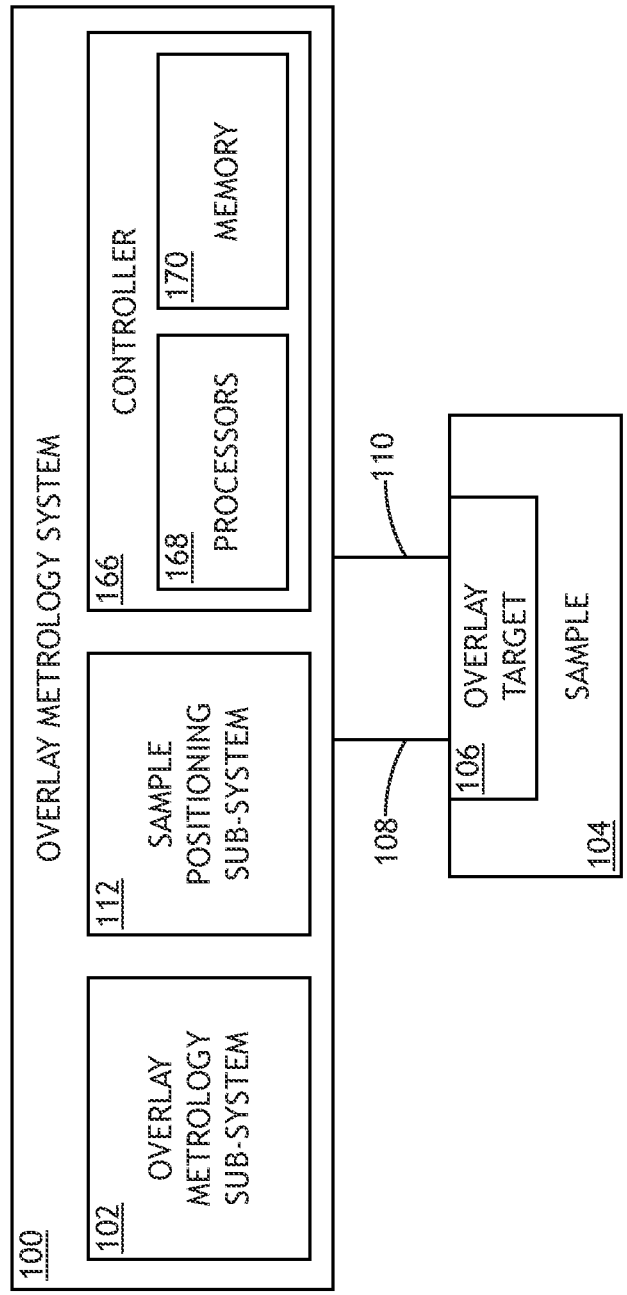
FIG. 1A is a block diagram view of overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for image-based overlay metrology of overlay targets having features axially separated by distances larger than a depth of focus of a collection objective lens in which the features are simultaneously in focus in a single image grab. In this way, features separated by large axial distances (e.g., relative to the objective depth of focus) may be simultaneously in focus in a single image of the overlay target. For the purposes of the present disclosure, overlay targets having features on axially-separated layers are referred to as tall overlay targets.

It is contemplated herein that an overlay metrology system (or sub-system) may be configured to according to various metrology recipes suitable for generating overlay measurements on overlay targets with various designs. For example, a metrology recipe may include various design parameters associated with a design of a particular overlay target as well as various parameters of the overlay metrology sub-system suitable for measuring the overlay target. In this way, various aspects of an overlay target and the overlay metrology sub-system suitable for characterizing the overlay target may be designed together to provide a measurement in accordance with the metrology recipe.

In some embodiments, a metrology recipe provides that an overlay target includes first grating features in a first layer of a sample having a first pitch and a second grating in a second layer of the sample having a second pitch different than the first pitch, where an axial distance between the first and second layers of the sample (e.g., a layer separation distance) is greater than a depth of focus (DOF) of an overlay metrology sub-system used to characterize the target. In this way, the gratings in the first and second layers would not be simultaneously in focus without further considerations. For the purposes of the present disclosure, a grating of an overlay target having a relatively larger pitch is referred to as a large-pitch grating and a grating of the overlay target having a relatively smaller pitch is referred to as a small-pitch grating.

In some embodiments, the metrology further provides that diffraction orders of interest for a particular measurement scheme are fully separated in different radial regions of a collection pupil of the overlay metrology sub-system. For example, the grating with the relatively larger pitch (e.g., the large-pitch grating) may provide diffraction orders in a first radial range of the collection pupil $0 < r < r_t$, while the grating with the relatively smaller pitch (e.g., the small-pitch grating) may provide diffraction orders in a second radial range of the collection pupil $r_t < r < r_{max}$. Here, $r_{max}$ corresponds to a boundary of the collection pupil (e.g., a maximum collection numerical aperture (NA)) and $r_t$ corresponds to a threshold radius separating the diffraction orders of the first and second gratings.

In some embodiments, an overlay metrology sub-system configured in accordance with the metrology recipe to measure overlay of the sample based on the overlay target includes collection optics providing a radially-varying defocus distribution to compensate for the layer separation distance. The diffraction orders of the illumination by the first and second illumination gratings may experience different portions of the radially-varying defocus distribution. As a result, the first and second gratings may be simultaneously in focus on a detector.

The overlay metrology sub-system may generally include any type or combination of elements providing radially-varying defocus.

In some embodiments, the overlay metrology sub-system includes a lens in a pupil plane (e.g., a relayed pupil plane), where the lens has a radius equal to the threshold radius. In this way, the lens may operate on the diffraction orders from the large-pitch grating but not on the diffraction orders from the small-pitch grating. Further, the lens may be a positive or negative lens as necessary to adjust a focal plane associated with the large-pitch grating to match that of the small-pitch grating. For example, the lens may be a positive lens when the large-pitch grating is closer to an objective lens than the small-pitch grating and may be a negative lens when the large-pitch grating is further from the objective lens than the small-pitch grating.

In some embodiments, the overlay metrology sub-system includes an objective lens with a correction collar that may be adjusted to provide a selected amount of spherical aberration. It is contemplated herein that spherical aberration corresponds to radially-dependent defocus. In this way, increasing spherical aberration in the lens increases an amount of defocus difference between light incident on a center of the objective lens relative to light incident near an edge of the lens. It is further contemplated herein that such a correction collar may be used to compensate for the layer separation distance and provide that the large-pitch and small-pitch gratings are simultaneously in focus.

Additional embodiments of the present disclosure are directed to tall overlay target designs suitable for measurement using the systems and methods disclosed herein.

Referring now to FIGS. 1A-6C, systems and methods for image-based overlay metrology on tall overlay targets are described in greater detail, in accordance with one or more embodiments of the present disclosure.

FIG. 1A is a block diagram view of an overlay metrology system 100, in accordance with one or more embodiments of the present disclosure. In some embodiments, an overlay metrology system 100 includes an overlay metrology sub-system 102 to generate overlay measurements associated with a sample 104 based on characterization of an overlay target 106 on the sample 104. For example, the overlay target 106 may include features on multiple layers of the sample 104. In this way, an overlay measurement of the sample 104 may be generated based on one or more images of the overlay target 106.

In some embodiments, the overlay metrology sub-system 102 generates at least one image of the overlay target 106. As an illustration, the overlay metrology sub-system 102 may illuminate the overlay target 106 with illumination including one or more illumination beams 108, collect light from the overlay target 106 (which is referred to herein as sample light 110), and generate an image of the overlay target 106 based on at least a portion of the sample light 110.

Further, the overlay metrology sub-system 102 may be configurable to generate measurements based on any number of metrology recipes defining various aspects of the overlay target 106 (e.g., a target design) or measurement parameters of the overlay metrology sub-system 102 suitable for generating an overlay measurement of a particular overlay target 106 with a particular target design.

Put another way, the overlay metrology sub-system 102 may be configured to provide a selected type of measurement for a selected overlay target design. For example, a metrology recipe may include various parameters associated with a design of the overlay target 106 such as, but not limited to, positions and orientations of sample features (e.g., pitches of grating features along particular directions). By way of another example, a metrology recipe may include various parameters associated with the position of the sample 104 during a measurement such as, but not limited to, a height, an orientation, whether the sample 104 is static during a measurement, or whether the sample 104 is in motion during a measurement (along with associated parameters describing the speed, scan pattern, or the like). By way of another example, a metrology recipe may include parameters of an illumination beam 108 such as, but not limited to, an illumination wavelength, an illumination pupil distribution (e.g., a distribution of illumination angles and associated intensities of illumination at those angles), a polarization of incident illumination, or a spatial distribution of illumination. By way of another example, a metrology recipe may include collection parameters associated with collection or filtering of the sample light 110 such as, but not limited to, a collection pupil distribution, collection field stop settings to select portions of the overlay target 106 of interest for imaging, a polarization of sample light 110, wavelength filters, or parameters for controlling one or more detectors.

In some embodiments, the overlay metrology sub-system 102 and/or the overlay target 106 are configured (e.g., in accordance with a metrology recipe) to be capable of capturing an image in which features of the overlay target 106 located on layers of the sample 104 that are axially separated by a distance (e.g., a layer separation distance) that is larger than a DOF are simultaneously in focus in a single image. Such an overlay metrology sub-system 102 may thus be suitable for, but is not limited to, overlay metrology for samples fabricated by advanced packaging techniques such as, but not limited to, die-to-wafer (D2 W) techniques, wafer-to-wafer (W2 W) techniques, or other three-dimensional (3D processing techniques). For example, D2 W or W2 W techniques may require overlay measurements (e.g., misregistration measurements more generally) between the constituent substrates or features on these constituent substrates. As an illustration, D2 W or W2 W techniques may require overlay measurements of features with layer separation distances on the order of hundreds of micrometers or more. It is further contemplated herein that the simultaneous imaging of such disparate features in a single image grab may substantially increase measurement throughput relative to alternative tools or techniques that generate separate images for features on axially-separated layers. In some embodiments, features of the overlay target 106 located on layers of the sample 104 that are axially separated by a distance (e.g., a layer separation distance) that is larger than a DOF are simultaneously in focus in a single image plane, but multiple detectors located at different instances of this image plane (e.g., in multiple collection channels) are used to capture different portions of the overlay target 106. In this way, sample light 110 associated with features on the different layers of the overlay target 106 may be isolated to improve image contrast, signal to noise ratio, or another quality metric.

In some embodiments, the overlay metrology system 100 includes a sample positioning sub-system 112 configured to adjust the sample 104 and/or the illumination beam 108 prior, during, and/or after a measurement. For example, the overlay metrology sub-system 102 may operate in a move-and-measure (MAM) operational mode in which the sample 104 is stationary during a measurement or in a scanning operational mode in which the sample 104 is in motion during a measurement.

Referring now to FIG. 2A-2D, an overlay target 106 having features separated by a relatively large axial distance is described in accordance with one or more embodiments of the present disclosure.

Figure 2A:
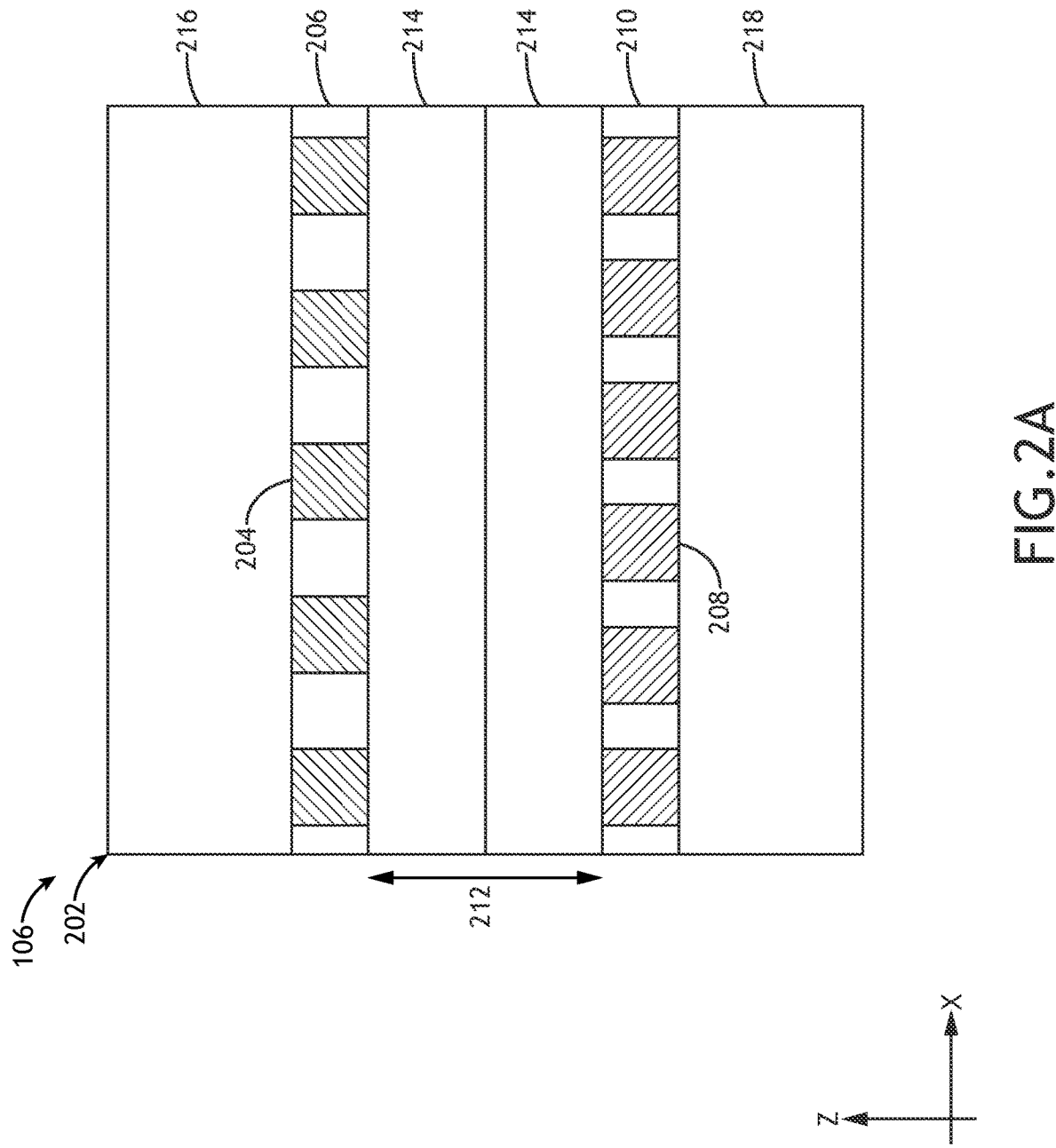
FIG. 2A is a side view of a cell of an overlay target, in accordance with one or more embodiments of the present disclosure.
Figure 2B:
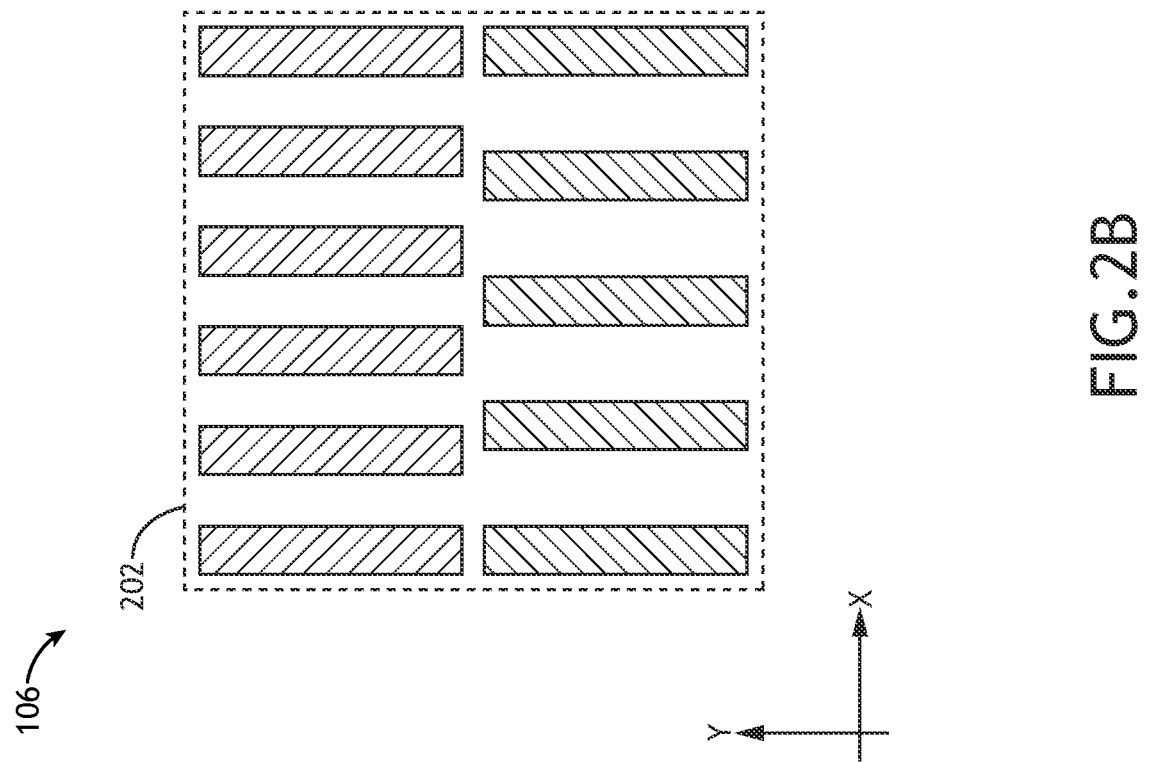
FIG. 2B is a top view of the cell of FIG. 2A, in accordance with one or more embodiments of the present disclosure.

FIG. 2A is a side view of a cell 202 of an overlay target 106, in accordance with one or more embodiments of the present disclosure. FIG. 2B is a top view of the cell 202 of FIG. 2A, in accordance with one or more embodiments of the present disclosure.

In some embodiments, the cell 202 includes a large-pitch grating 204 (e.g., a first-layer grating) located on a first layer 206 of the sample 104 and a small-pitch grating 208 (e.g., a second-layer grating) located on a second layer 210 of the sample 104. The first layer 206 and the second layer 210 may further be separated by layer separation distance 212, which is represented in FIG. 2A as an axial separation distance along the Z direction.

For example, the first layer 206 and the second layer 210 may be separated by any number of intermediate layers 214.

The overlay target 106 (or the sample 104 more generally) may further include one or more substrates. As an illustration, FIG. 2A depicts a first substrate 216 proximate to the large-pitch grating 204 and a second substrate 218 proximate to the small-pitch grating 208. In this way, the overlay target 106 may be formed on a wide range of sample types. For example, the sample 104 may be a D2 W bonded sample, where the first substrate 216 is a die and the second substrate 218 is a wafer. In this configuration, the large-pitch grating 204 and optionally at least some of the intermediate layers 214 are fabricated as part of the die while the small-pitch grating 208 and optionally at least some of the intermediate layers 214 are fabricated as part of the wafer prior to bonding. As another example, the sample 104 may be a W2 W bonded sample, where the first substrate 216 is a first wafer and the second substrate 218 is a second wafer. In this configuration, the large-pitch grating 204 and optionally at least some of the intermediate layers 214 are fabricated as part of the first wafer while the small-pitch grating 208 and optionally at least some of the intermediate layers 214 are fabricated as part of the second wafer prior to bonding.

Figure 2C:
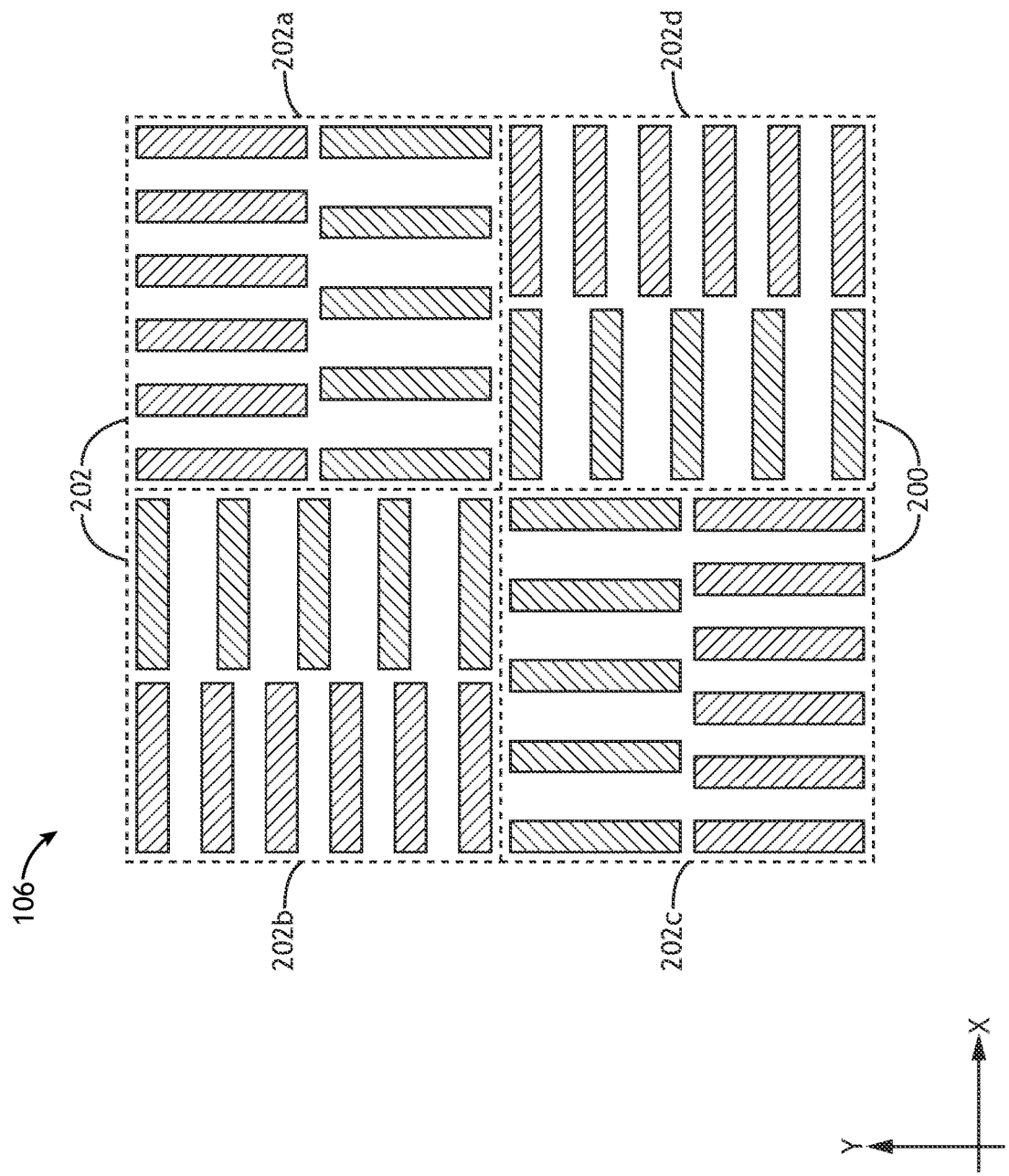
FIG. 2C is a top view of an overlay target including four cells, in accordance with one or more embodiments of the present disclosure.

Referring now to FIGS. 2B and 2C, various non-limiting designs of an overlay target 106 are described in greater detail, in accordance with one or more embodiments of the present disclosure.

An overlay target 106 may generally be formed from one or more cells 202, where any particular cell 202 may include grating structures (e.g., the large-pitch grating 204 and the small-pitch grating 208) with any periods and with periodicity along any direction (e.g., an X direction illustrated in FIG. 2A). Further, the constituent gratings within any particular cell 202 may be located in overlapping regions, partially-overlapping regions, or non-overlapping regions. In this way, the overlay target 106 may have any suitable design including, but not limited to, an advanced imaging metrology (AIM) target, a robust AIM (rAIM) target, a triple AIM target, or a Moiré target (e.g., a grating-over-grating target).

As an illustration, FIG. 2B is a top view of an overlay target 106 including a single cell 202 suitable for measurement along one direction (e.g., the X direction here). As another illustration, FIG. 2C is a top view of an overlay target 106 including four cells 202, in accordance with one or more embodiments of the present disclosure. For example, the overlay target 106 in FIG. 2B may be characterized as having an AIM target design. In particular, the overlay target 106 in FIG. 2B includes cells 202a,c having constituent gratings oriented along the X direction (e.g., a first measurement direction) and cells 202b,d oriented along the Y direction (e.g., a second measurement direction).

The overlay target 106 and/or any particular cell 202 may generally be located at any suitable location on the sample 104 such as, but not limited to, within a scribe line between dies or within a die.

Figure 2D:
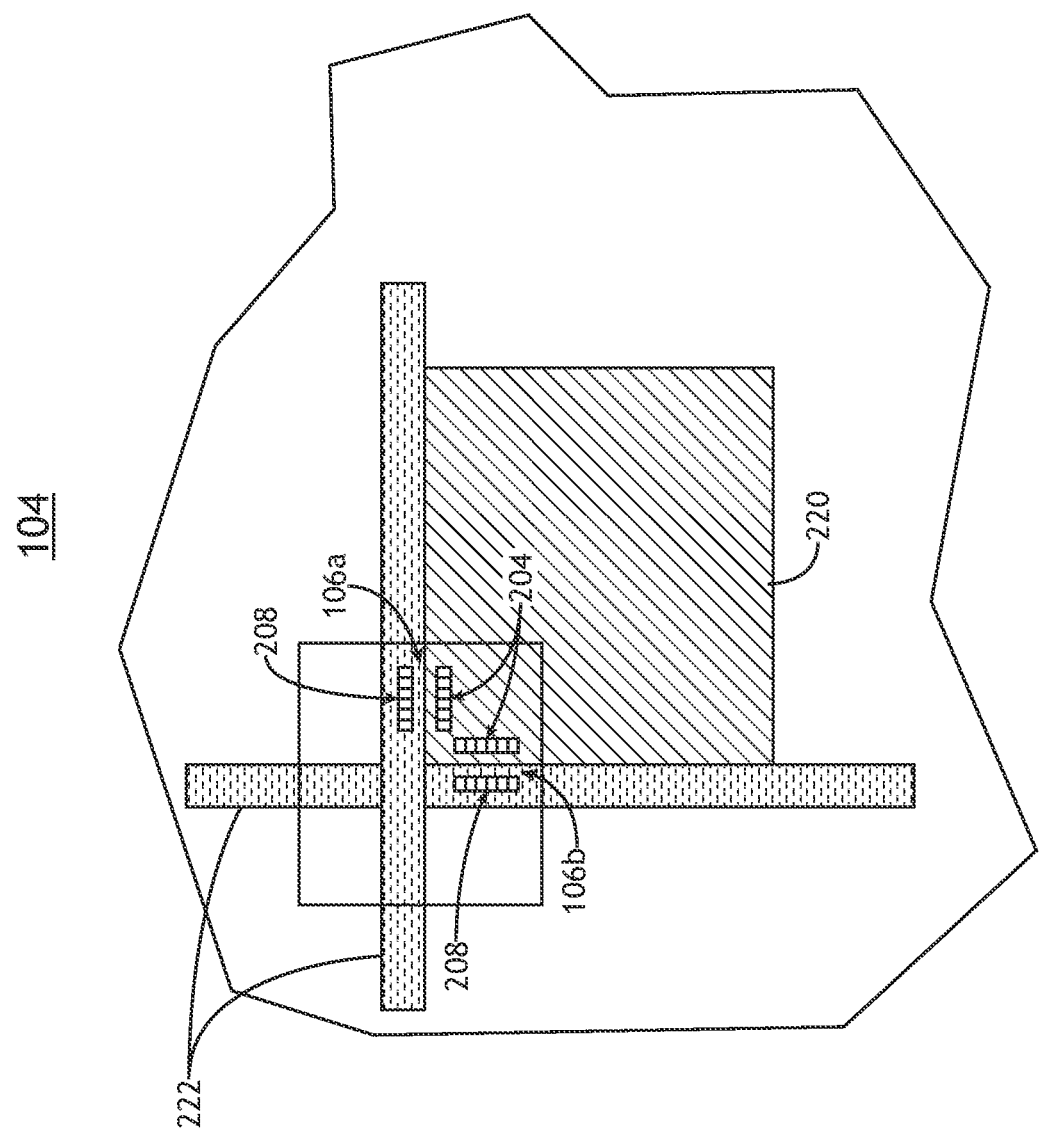
FIG. 2D is a top view of a portion of a sample depicting two overlay targets with cells having features split between a die and a scribe line, in accordance with one or more embodiments of the present disclosure.

In some embodiments, different portions of the overlay target 106 and/or any particular cell 202 are split between a scribe line and a die. FIG. 2D is a top view of a portion of a sample 104 depicting two overlay targets 106 with cells 202 having features split between a die 220 and a scribe line 222, in accordance with one or more embodiments of the present disclosure. For example, the sample 104 may be a D2 W sample, where the die 220 may correspond to the first substrate 216 and the scribe line 222 is on the second substrate 218. In particular, FIG. 2D depicts a first overlay target 106a and a second overlay target 106b, where each of the overlay targets 106a,b are configured with a single cell 202 as shown in FIG. 2B arranged for 1D measurements. For example, the first overlay target 106a has features distributed along the X direction for measurements along the X direction, whereas the second overlay target 106b has features distributed along the Y direction for measurements along the Y direction. Further, each of the overlay targets 106a,b have a large-pitch grating 204 located in a die 220 and the small-pitch grating 208 located in the scribe line 222. As described with respect to FIG. 2A, the in-die features (e.g., the large-pitch grating 204 here) may be located on a surface of the die 220 or may be buried within the sample 104. In way, such a design may be suitable for, but not limited to, applications including two or more stacked dies 220. Further, it is to be understood that the particular configuration of the large-pitch grating 204 in the die 220 and the small-pitch grating 208 in the scribe line 222 is merely illustrative and not limiting on the present disclosure. Rather, any suitable arrangement of the large-pitch grating 204 and the small-pitch grating 208 is within the spirit and scope of the present disclosure.

It is contemplated herein that the design of the overlay targets 106a,b may provide several benefits. For example, the single-cell 1D design may enable such overlay targets 106 to be relatively small and thus limit the space on the sample 104 dedicated to overlay measurements. As another example, the use of separate overlay targets 106a,b for separate measurements along different directions (e.g., X and Y directions) located at different positions on the sample 104 may facilitate compensation for rotation of the sample 104 relative to the overlay metrology sub-system 102. As another example, the placement of such overlay targets 106 near an intersection between scribe lines 222 (e.g., an intersection between neighboring dies 220 may enable efficient measurement sampling. For instance, the overlay targets 106a,b may both be simultaneously within a single field of view 224 of the overlay metrology sub-system 102 and thus be simultaneously characterized. Further, such overlay targets 106a,b may provide measurements that are accurate for all four adjacent dies 220 (or at least portions thereof).

Figure 1B:
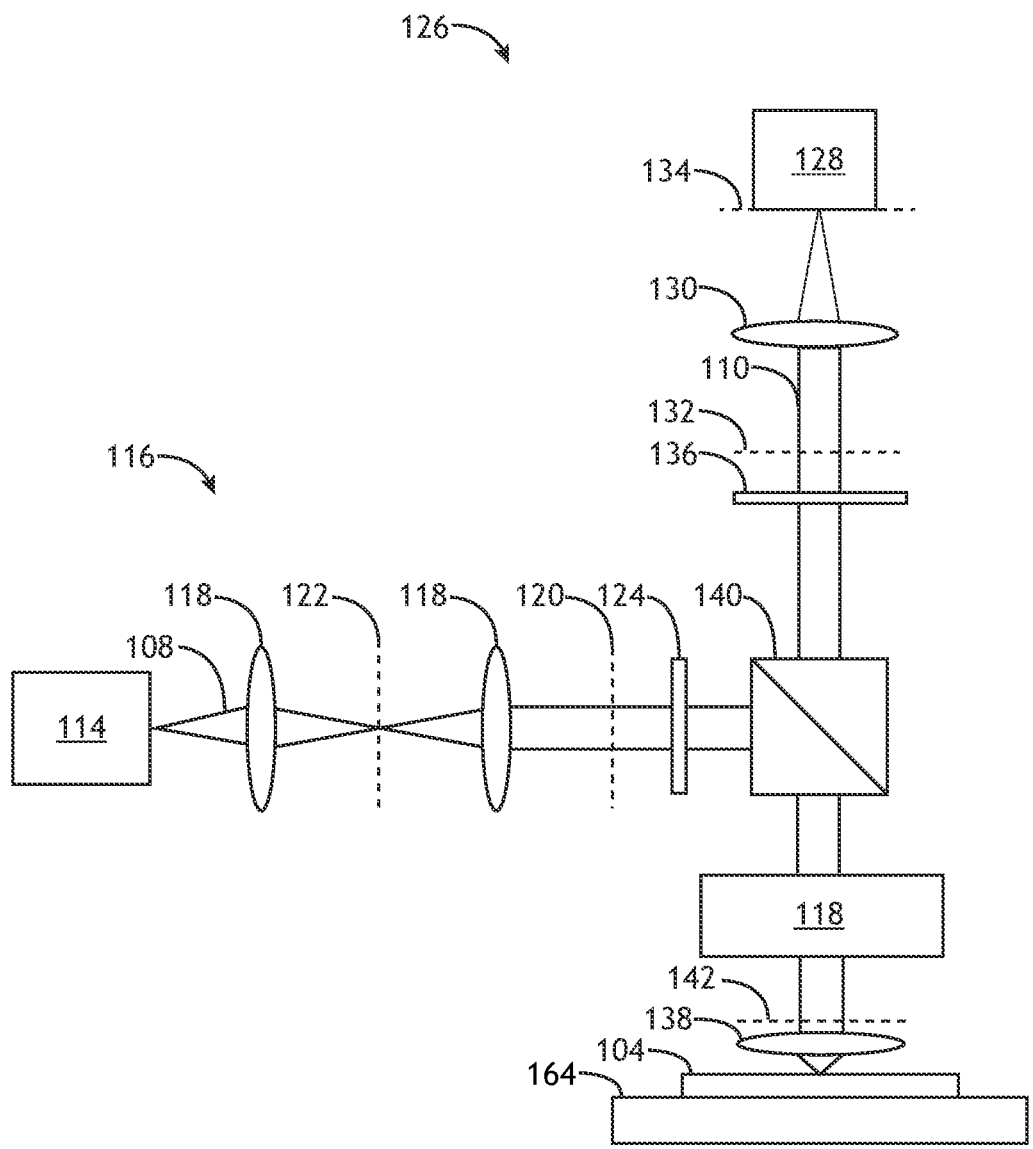
FIG. 1B is a conceptual view of an overlay metrology sub-system, in accordance with one or more embodiments of the present disclosure.

Referring now to FIG. 1B, FIG. 1B is a conceptual view of an overlay metrology sub-system 102, in accordance with one or more embodiments of the present disclosure.

In some embodiments, the overlay metrology sub-system 102 includes an illumination source 114 configured to generate illumination to be directed to the sample 104 in the form of one or more illumination beams 108. In some embodiments, the overlay metrology system 100 includes an illumination pathway 116 (e.g., an illumination sub-system) including one or more components to direct one or more illumination beams 108 to the sample 104. For example, the illumination pathway 116 may include one or more illumination lenses 118 to direct one or more illumination beams 108 from the illumination source 114 to the sample 104. Additionally, the illumination lenses 118 may be arranged to provide one or more conjugate or relayed illumination pupil planes 120 and/or illumination field planes 122. The illumination pathway 116 may further include one or more illumination conditioning components 124 suitable for modifying and/or conditioning the one or more illumination beams 108. The illumination conditioning components 124 may be, but are not required to be, located at illumination pupil planes 120 and/or illumination field planes in the illumination pathway 116. For example, the one or more illumination conditioning components 124 may include, but are not limited to, an illumination aperture stop, an illumination field stop, one or more polarizers, one or more compensators, one or more filters, one or more beam splitters, one or more diffusers, one or more homogenizers, one or more apodizers, one or more beam shapers, one or more mirrors, or one or more lenses.

In some embodiments, the overlay metrology sub-system 102 includes a collection pathway 126 (e.g., an imaging sub-system) including one or more components to collect sample light 110 (e.g., light emanating from the sample 104 in response to one or more illumination beams 108) and direct at least a portion of this sample light 110 to a one detector 128. The sample light 110 may include any type of light emanating from the sample 104 including, but not limited to, diffracted, scattered, or reflected light. In some embodiments, the collection pathway 126 includes one or more collection lenses 130 to direct the sample light 110 from the sample 104 to the detector 128. Additionally, the collection lenses 130 may be arranged to provide one or more conjugate or relayed collection pupil planes 132 and/or collection field planes 134. In some embodiments, the collection pathway 126 includes one or more collection conditioning components 136 suitable for modifying and/or conditioning the sample light 110. For example, the one or more collection conditioning components 136 may include, but are not limited to, a collection aperture stop, a collection field stop, one or more polarizers, one or more compensators, one or more filters, one or more beam splitters, one or more diffusers, one or more homogenizers, one or more apodizers, one or more beam shapers, one or more mirrors, or one or more lenses.

The detector 128 may include any optical detector known in the art suitable for capturing sample light 110 received from the sample 104. Further, the detector 128 may be suitable for capturing images of a sample 104 that is either stationary or moving. For example, a detector 128 may include, but is not limited to, a photodiode array (PDA), a charge-coupled device (CCD), a complementary metal-oxide semiconductor (CMOS) device, a time-delay integration (TDI) detector, a line-scan detector, a photomultiplier tube (PMT), an avalanche photodiode (APD), or the like. In some embodiments, a detector 128 may include a spectroscopic detector suitable for identifying wavelengths of radiation emanating from the sample 104 and dispersed onto a sensor using a dispersive element.

In some embodiments, although not explicitly shown, the overlay metrology sub-system 102 includes two or more detectors 128. For example, the collection pathway 126 may include one or more additional beamsplitters to separate the sample light 110 into two or more collection channels. Further, the collection pathway 126 may separate the sample light 110 into the various collection channels using any technique known in the art. For example, the collection pathway 126 may include one or more optical elements to separate the sample light 110 based on polarization, wavelength, or any other suitable optical property (e.g., using the additional beamsplitters, polarizers, dichroic mirrors, or other elements). This configuration may be suitable for, but is not limited to, cases where sample light 110 associated with features on different layers of the overlay target 106 is optically distinguishable. As another example, the collection pathway 126 may include one or more spatial filters or beam blockers to spatially isolate features on different layers of the overlay target 106 in the various collection channels.

In some embodiments, the overlay metrology sub-system 102 includes an objective lens 138 to simultaneously direct one or more illumination beams 108 to the sample 104 and capture the sample light 110 from the sample 104. For example, as illustrated in FIG. 1B, the overlay metrology sub-system 102 may include a beamsplitter 140 common to both the illumination pathway 116 and the collection pathway 126. Further, a pupil plane 142 may also be common to both the illumination pathway 116 and the collection pathway 126 and thus conjugate to the illumination pupil plane 120 and the collection pupil plane 132.

Figure 3B:
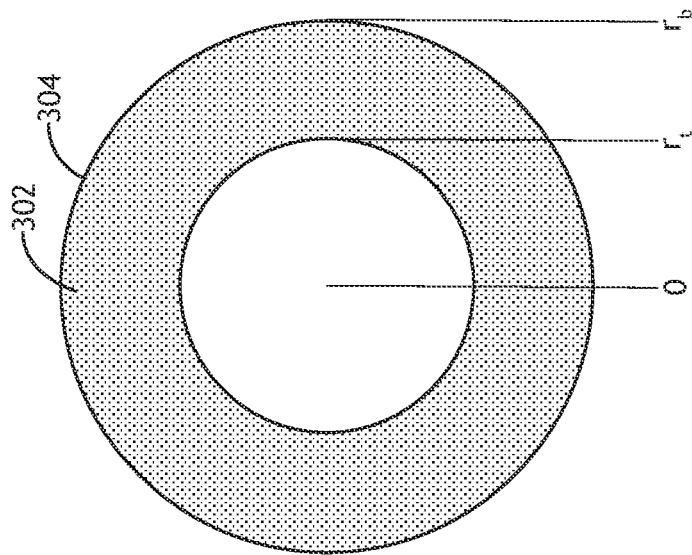
FIG. 3B is a top view of a collection pupil plane including an annular phase plate, in accordance with one or more embodiments of the present disclosure.
Figure 3A:
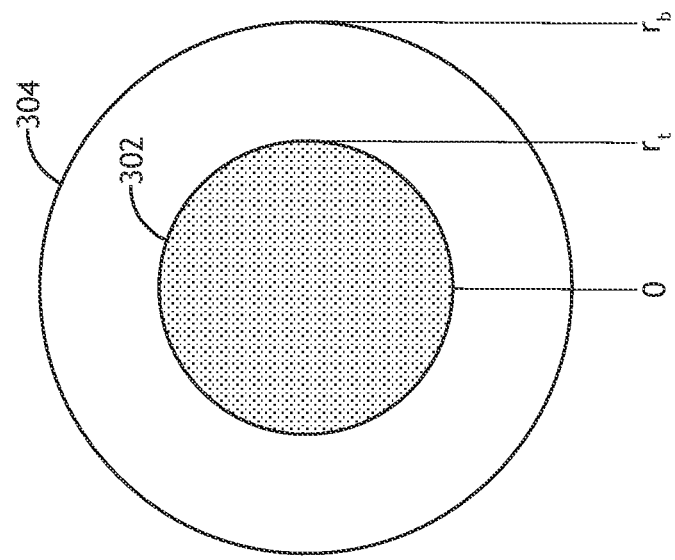
FIG. 3A is a top view of a collection pupil plane including a phase plate having a radius smaller than a boundary of the collection pupil plane, in accordance with one or more embodiments of the present disclosure.

Referring now to FIGS. 3A-3B, overlay metrology on tall overlay targets 106 is described in greater detail in accordance with one or more embodiments of the present disclosure. For example, a tall overlay target 106 may have a large-pitch grating 204 and a small-pitch grating 208 with a layer-separation distance greater than a DOF of the objective lens 138 or the collection pathway 126 more generally.

In some embodiments, an overlay metrology sub-system 102 (e.g., a collection pathway 126 of an overlay metrology sub-system 102) is configurable in accordance with a metrology recipe to provide a radially-varying defocus distribution to compensate for the layer separation distance 212. In this way, the diffraction orders of the one or more illumination beams 108 by the large-pitch grating 204 and the small-pitch grating 208 may be subject to different portions of the radially-varying defocus distribution. As a result, the large-pitch grating 204 and the small-pitch grating 208 may be simultaneously in focus on a detector 128.

The overlay metrology sub-system 102 may provide any radially-varying defocus distribution suitable for compensating for a layer separation distance 212 between features of an overlay target 106 such that features within the respective layers are simultaneously in focus on a detector 128. Further, the radially-varying defocus distribution may be implemented using any combination of components in the overlay metrology sub-system 102 including, but not limited to, components of the collection pathway 126 (e.g., collection lenses 130, collection conditioning components 136, or the like).

In some embodiments, the overlay metrology sub-system 102 includes a phase plate in a collection pupil plane 132 to provide a radially-varying defocus distribution. The phase plate may have any size or spatially-varying phase distribution suitable for providing a selected radially-varying defocus distribution.

FIG. 3A is a top view of a collection pupil plane 132 including a phase plate 302 having a radius smaller than a boundary 304 ($r_b$) of the collection pupil plane 132, in accordance with one or more embodiments of the present disclosure. In particular, the phase plate 302 illustrated in FIG. 3A has a radius of $r_t$. In this way, the phase plate 302 may introduce defocus to portions of the light in the collection pupil plane 132 at locations up to the radius $r_t$ of the phase plate 302 (e.g., radius values of $0 \leq r < r_t$), while portions of the light in the collection pupil plane 132 at locations beyond the radius $r_t$ may not be impacted by the phase plate 302 (e.g., radius values of $r_t \leq r \leq r_b$). As a result, the phase plate 302 may compensate for a layer separation distance 212 between layers of the overlay target 106 such that the features on the layers (e.g., the large-pitch grating 204 and the small-pitch grating 208 in FIG. 2) may be simultaneously in focus on the detector 128.

FIG. 3B is a top view of a collection pupil plane 132 including an annular phase plate 302, in accordance with one or more embodiments of the present disclosure. In particular, the phase plate 302 illustrated in FIG. 3B spans radius values within the collection pupil plane 132 of $r_t \leq r \leq r_b$. In this way, the phase plate 302 may introduce defocus to portions of the light in the collection pupil plane 132 at locations beyond the radius $r_t$ (e.g., radius values of $r_t \leq r \leq r_b$), while portions of the light in the collection pupil plane 132 at locations lower than the radius $r_t$ may not be impacted by the phase plate 302 (e.g., radius values of $0 \leq r < r_t$).

Referring generally to FIGS. 3A and 3B, a phase plate 302 may be located at any suitable location. For example, a phase plate 302 may be located at a relayed collection pupil plane 132 corresponding to a relayed version (e.g., a conjugate version) of the back focal plane of the objective lens 138.

Further, a phase plate 302 may provide phase delays with any spatial distribution. In some embodiments, a phase plate 302 provides a uniform phase delay. Such a phase plate 302 may be suitable for configurations in which the phase plate 302 is smaller than a boundary 304 of the collection pupil plane 132 (e.g., as illustrated in FIGS. 3A and 3B). In this way, a radially-varying defocus distribution may be generated across the collection pupil plane 132 since the phase plate 302 interacts with only a portion of the light within the collection pupil plane 132. Further, the overlay metrology sub-system 102 may include multiple radially-symmetric phase plates 302 to provide different phase delays within multiple radial regions of the illumination pupil plane 120. These phase plates 302 may be located in a single collection pupil plane 132 or in different relayed planes (e.g., conjugate planes). Such a configuration may be suitable for, but is not limited to, providing that features on three or more layers of an overlay target 106 (e.g., a triple AIM target, or the like) are simultaneously in focus on the detector 128.

In some embodiments, a phase plate 302 provides a non-uniform phase delay across the collection pupil plane 132. For example, a phase plate 302 may provide different uniform phase delays within two or more radial zones within the collection pupil plane 132. As an illustration, a single phase plate 302 may provide a first phase delay for light below a threshold radius $0 \leq r \leq r_t$ and a second phase delay for light above the threshold radius $r_t < r \leq r_b$. In this way, a single phase plate 302 spanning the collection pupil plane 132 may operate in a manner similar to the configuration illustrated in FIG. 3A.

As another example, a phase plate 302 may provide a radially-symmetric smoothly-varying phase delay distribution across the collection pupil plane 132. For instance, the phase plate 302 may be formed as a lens located in the collection pupil plane 132. As an illustration, a lens located in the collection pupil plane 132 with a radius smaller than the boundary 304 of the collection pupil plane 132 may operate in a manner similar to that illustrated in FIG. 3A. As another illustration, a lens located in the collection pupil plane 132 with a radius equal to or larger than the boundary 304 of the collection pupil plane 132 may have a sufficiently large phase delay distribution across the collection pupil plane 132 to compensate for the layer separation distance 212 directly.

It is further contemplated herein that spherical aberration in one or more components (e.g., one or more lenses) may provide a radially-varying defocus distribution. Accordingly, the overlay metrology sub-system 102 may include one or more lenses with a spherical aberration sufficient to compensate for a layer separation distance of an overlay target 106 such that features on multiple layers of the overlay target 106 may be simultaneously in focus on the detector 128.

In some embodiments, the overlay metrology sub-system 102 includes an objective lens 138 having spherical aberration to provide a radially-varying defocus distribution sufficient for overlay measurements on a tall cell 202. For example, the objective lens 138 may include one or more components to provide an adjustable amount of spherical aberration. Such an objective lens 138 may include, but is not required to include, one or more optical elements (e.g., lenses) having positions that are adjustable with an adjustment device such as a correction collar, an adjustment collar, or the like.

An objective lens 138 with an adjustable spherical aberration may typically be used to compensate for spherical aberrations induced by a microscopic cover slide or other component in an optical pathway prior to a sample of interest. However, it is contemplated herein that an overlay metrology sub-system 102 may utilize an objective lens 138 with an adjustable spherical aberration to intentionally introduce radially-varying defocus during a measurement. Further, the amount of spherical aberration, and thus the amount of radially-varying defocus, may be selected (e.g., based on a metrology recipe) to compensate for the layer separation distance 212 between layers of an overlay target 106 such that features on the layers may be simultaneously in focus on a detector 128. It is additionally contemplated herein that an objective lens 138 with adjustable spherical aberration may compensate for the layer separation distance 212 directly without requiring additional components in a relayed collection pupil plane 132, which may beneficially provide a relatively simple and robust design of the overlay metrology sub-system 102.

Referring now to FIGS. 4A-6C, overlay metrology on tall overlay targets 106 using different imaging modes is described in greater detail, in accordance with one or more embodiments of the present disclosure. The overlay metrology sub-system 102 may be configured to operate in a variety of imaging modes including, but not limited to, a bright-field imaging mode or a dark-field imaging mode.

Figure 4A:
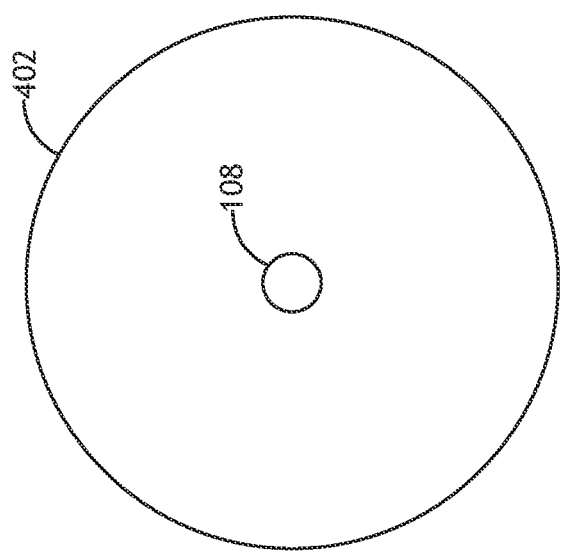
FIG. 4A is a top view of an illumination pupil plane providing a single illumination beam at normal incidence, in accordance with one or more embodiments of the present disclosure.

FIG. 4A is a top view of an illumination pupil plane 120 providing a single illumination beam 108 at normal incidence, in accordance with one or more embodiments of the present disclosure. In particular, FIG. 4A illustrates a single illumination beam 108 centered within a boundary 402 of the illumination pupil plane 120.

Figure 4C:
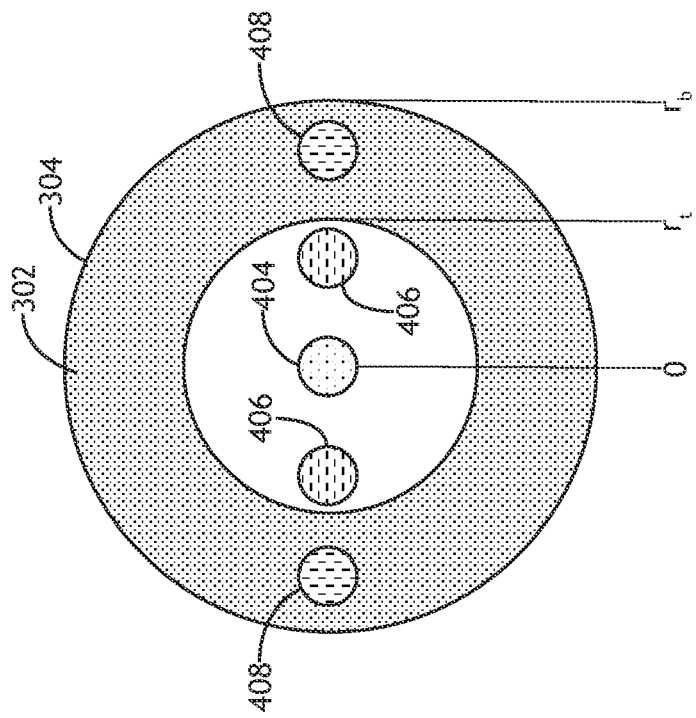
FIG. 4C is a top view of a collection pupil plane configured for mixed bright-field and dark-field imaging with a phase plate configured as illustrated in FIG. 3B, in accordance with one or more embodiments of the present disclosure.
Figure 4B:
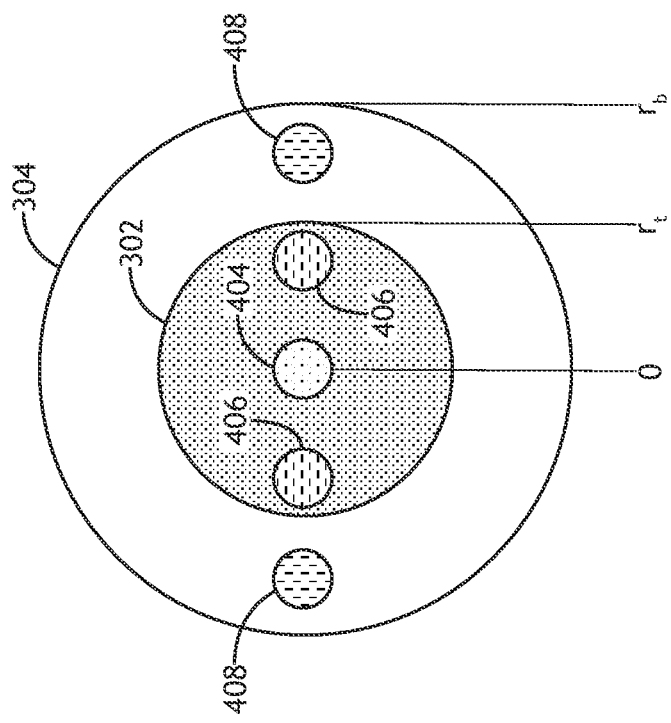
FIG. 4B is a top view of a collection pupil plane configured for mixed bright-field and dark-field imaging with a phase plate configured as illustrated in FIG. 3A, in accordance with one or more embodiments of the present disclosure.

FIGS. 4B-4E illustrate various non-limiting imaging configurations based on illumination with the profile shown in FIG. 4A. FIG. 4B is a top view of a collection pupil plane 132 configured for imaging with a phase plate 302 configured as illustrated in FIG. 3A, in accordance with one or more embodiments of the present disclosure. FIG. 4C is a top view of a collection pupil plane 132 configured for imaging with a phase plate 302 configured as illustrated in FIG. 3B, in accordance with one or more embodiments of the present disclosure.

FIGS. 4B and 4C illustrate a 0-order diffraction lobe 404 (e.g., specular reflection of the illumination beam 108), two large-pitch diffraction lobes 406 associated with diffraction of the illumination beam 108 by a large-pitch grating 204, and two small-pitch diffraction lobes 408 associated with diffraction of the illumination beam 108 by the small-pitch grating 208. For example, the large-pitch diffraction lobes 406 and the small-pitch diffraction lobes 408 may have any diffraction order. For instance, the large-pitch diffraction lobes 406 and/or the small-pitch diffraction lobes 408 may include, but are not limited to, +/−1 order (first-order) diffraction lobes.

Because the large-pitch grating 204 and the small-pitch grating 208 have different pitches, the large-pitch diffraction lobes 406 and the small-pitch diffraction lobes 408 may be positioned at different radial locations in the collection pupil plane 132. As a result, the overlay metrology sub-system 102 may provide a radially-varying defocus distribution to introduce different amounts of defocus to the large-pitch diffraction lobes 406 and the small-pitch diffraction lobes 408 to compensate for the layer separation distance 212 such that the large-pitch grating 204 and the small-pitch grating 208 may be simultaneously in focus on the detector 128.

As an illustration, FIG. 4B depicts a phase plate 302 having a radius ($r_t$) centered in the collection pupil plane 132 to introduce defocus to the large-pitch diffraction lobes 406 and the but not the small-pitch diffraction lobes 408. In this configuration, the detector 128 may be located at a field plane conjugate to the small-pitch grating 208 such that the small-pitch grating 208 is in focus and the phase plate 302 may introduce sufficient defocus to the large-pitch diffraction lobes 406 to provide that the large-pitch grating 204 is also in focus on the detector despite the layer separation distance 212. Because the phase plate 302 also introduces at least some defocus to the 0-order diffraction lobe 404, the portion of an image including the large-pitch grating 204 may be a bright-field image. However, the 0-order diffraction lobe 404 may contribute less to the image of the small-pitch grating 208.

As another illustration, FIG. 4C depicts an annular phase plate 302 with an inner radius ($r_t$) and an outer radius equal to or greater than the boundary 304 in the collection pupil plane 132 to introduce defocus to the small-pitch diffraction lobes 408 but not the large-pitch diffraction lobes 406. In this configuration, the detector 128 may be located at a field plane conjugate to the large-pitch grating 204 such that the large-pitch grating 204 is in focus and the phase plate 302 may introduce sufficient defocus to the small-pitch diffraction lobes 408 to provide that the small-pitch grating 208 is also in focus on the detector despite the layer separation distance 212.

It is to be understood that although FIGS. 4B and 4C depict the use of phase plates 302 which may be located in any collection pupil plane 132, this is solely for illustrative purposes and is not limiting on the present disclosure. Rather, the overlay metrology sub-system 102 may include any suitable phase plate 302 at any location suitable for providing radially-varying defocus selected to compensate for the layer separation distance 212 such that the large-pitch grating 204 and the small-pitch grating 208 are simultaneously in focus on the detector 128. In some embodiments, the overlay metrology sub-system 102 includes an objective lens 138 providing a spherical aberration that introduces different amounts of defocus to the large-pitch diffraction lobes 406 and the small-pitch diffraction lobes 408 to provide that the large-pitch grating 204 and the small-pitch grating 208 are simultaneously in focus on the detector 128.

Figure 4E:
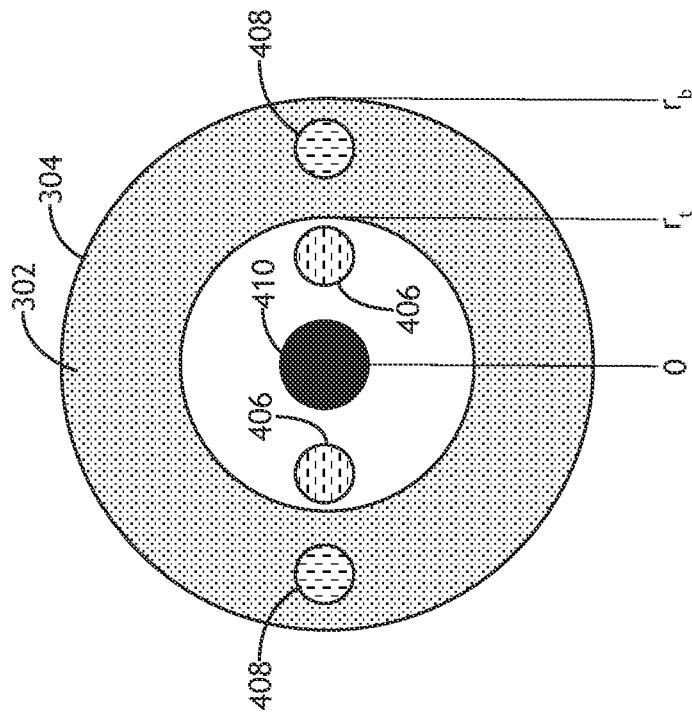
FIG. 4E is a top view of a collection pupil plane configured for dark-field imaging with a phase plate configured as illustrated in FIG. 3B, in accordance with one or more embodiments of the present disclosure.
Figure 4D:
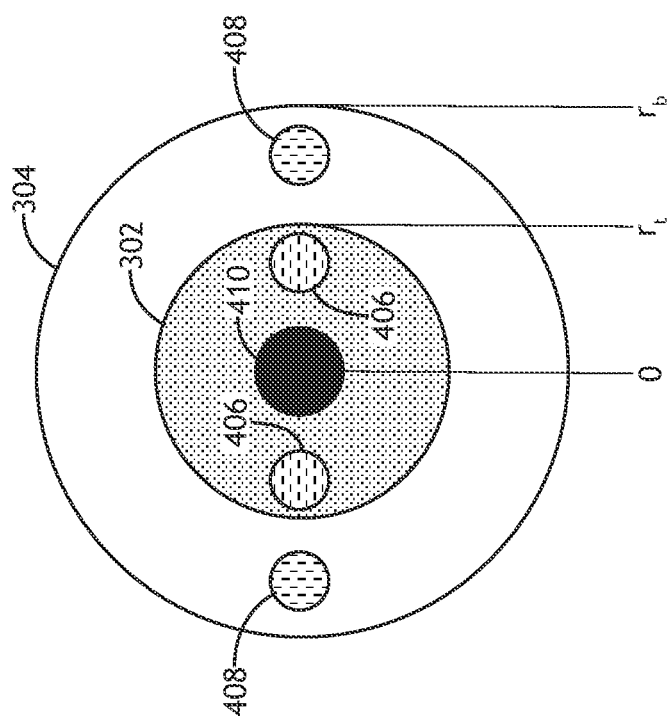
FIG. 4D is a top view of a collection pupil plane configured for dark-field imaging with a phase plate configured as illustrated in FIG. 3A, in accordance with one or more embodiments of the present disclosure.

FIGS. 4D and 4E depict dark-field imaging of a tall overlay target 106, in accordance with one or more embodiments of the present disclosure. In particular, FIG. 4D is a top view of a collection pupil plane 132 configured for dark-field imaging with a phase plate 302 configured as illustrated in FIG. 3A, in accordance with one or more embodiments of the present disclosure. FIG. 4E is a top view of a collection pupil plane 132 configured for dark-field imaging with a phase plate 302 configured as illustrated in FIG. 3B, in accordance with one or more embodiments of the present disclosure. FIGS. 4D and 4E are similar to FIGS. 4B and 4C, respectively, except that FIGS. 4D and 4E depict a blocker 410 positioned to block the 0-order diffraction lobe 404 and thus provide dark-field imaging for both the large-pitch grating 204 and the small-pitch grating 208. The blocker 410 may be located in any collection pupil plane 132 (e.g., a relayed collection pupil plane 132). In some embodiments, the blocker 410 is located in a plane common to the phase plate 302. In some embodiments, the blocker 410 is located in a different (e.g., relayed) collection pupil plane 132 than the phase plate 302.

Figure 5A:
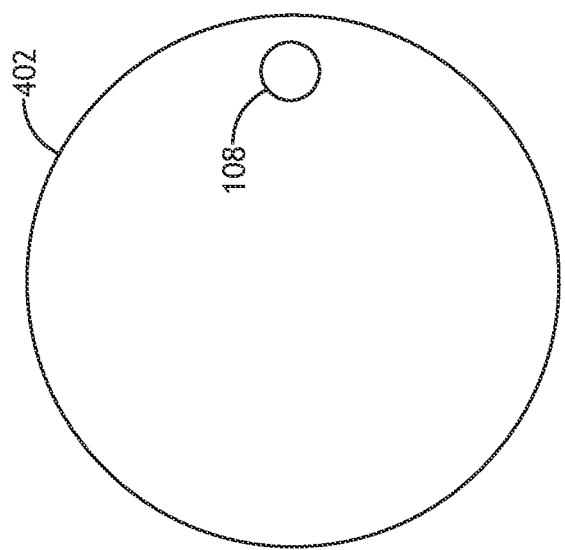
FIG. 5A is a top view of an illumination pupil plane providing an illumination beam at an oblique incidence angle, in accordance with one or more embodiments of the present disclosure.
Figure 5C:
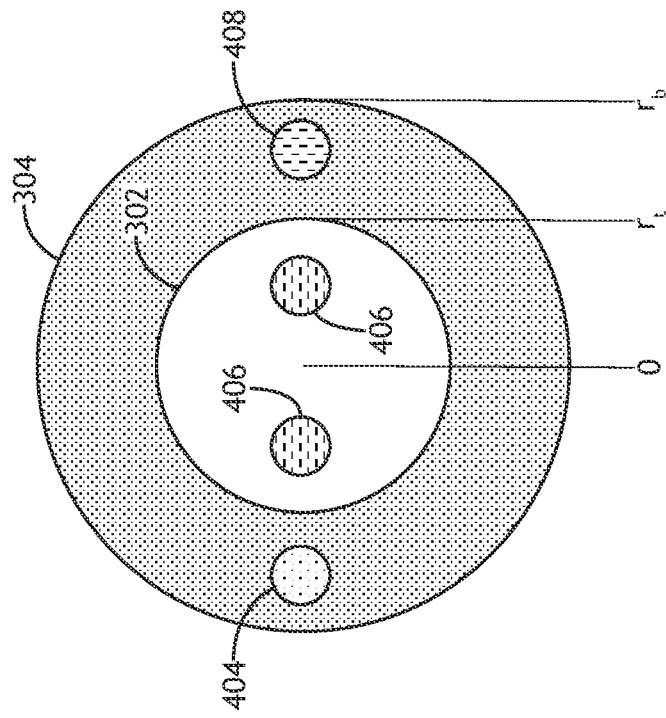
FIG. 5C is a top view of a collection pupil plane configured for imaging based on oblique illumination and having a phase plate configured as illustrated in FIG. 3B for imaging based on oblique illumination, in accordance with one or more embodiments of the present disclosure.
Figure 5B:
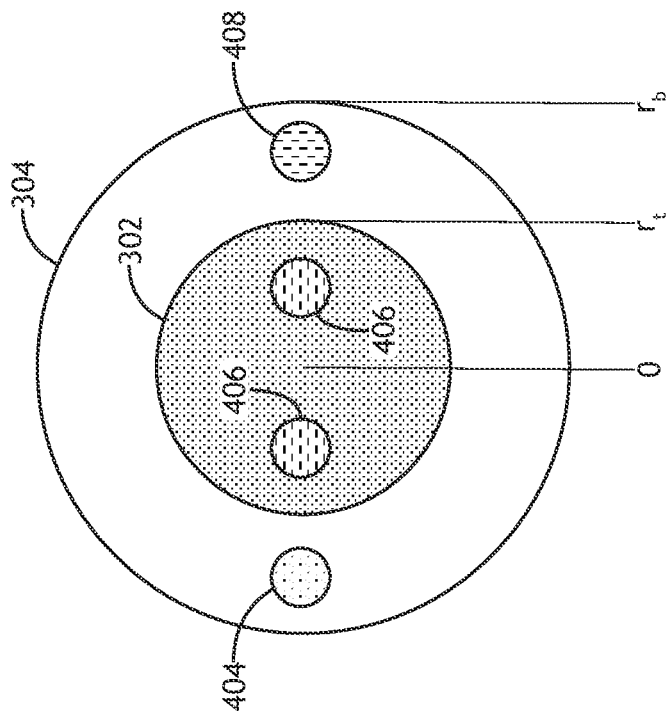
FIG. 5B is a top view of a collection pupil plane configured for imaging based on oblique illumination and having a phase plate configured as illustrated in FIG. 3A, in accordance with one or more embodiments of the present disclosure.

Referring now to FIGS. 5A-5C, various non-limiting imaging configurations associated with oblique illumination are described in greater detail, in accordance with one or more embodiments of the present disclosure.

FIG. 5A is a top view of an illumination pupil plane 120 providing an illumination beam 108 at an oblique incidence angle, in accordance with one or more embodiments of the present disclosure. FIG. 5B is a top view of a collection pupil plane 132 configured for imaging based on oblique illumination and having a phase plate 302 configured as illustrated in FIG. 3A, in accordance with one or more embodiments of the present disclosure. FIG. 5C is a top view of a collection pupil plane 132 configured for imaging based on oblique illumination and having a phase plate 302 configured as illustrated in FIG. 3B for imaging based on oblique illumination, in accordance with one or more embodiments of the present disclosure.

FIGS. 5B and 5C illustrate a 0-order diffraction lobe 404 (e.g., specular reflection of the illumination beam 108), a single small-pitch diffraction lobe 408 associated with diffraction of the illumination beam 108 by a small-pitch grating 208, and two large-pitch diffraction lobes 406 associated with diffraction of the illumination beam 108 by a large-pitch grating 204. Additionally, FIGS. 5B and 5C depict a Littrow configuration of the overlay metrology sub-system 102 and the small-pitch grating 208 (e.g., in accordance with a metrology recipe) in which the single small-pitch diffraction lobe 408 is retroreflected back along the illumination beam 108 shown in FIG. 5A. Further, the overlay metrology sub-system 102 and the overlay target 106 are further configured (e.g., in accordance with a metrology recipe) to provide that two large-pitch diffraction lobes 406 (e.g., a first-order diffraction lobe and a second-order diffraction lobe) are both located at smaller radial positions in the collection pupil plane 132 such that the light from the large-pitch grating 204 and the small-pitch grating 208 may be subjected to different amounts of defocus based on a radially-varying defocus distribution as disclosed herein.

For example, FIG. 5B illustrates a configuration in which the phase plate 302 introduces defocus to the large-pitch diffraction lobes 406 but not the 0-order diffraction lobe 404 or the small-pitch diffraction lobe 408. In this configuration, the detector 128 may be located at a field plane conjugate to the small-pitch grating 208 such that a bright-field image is formed based on the 0-order diffraction lobe 404 and the small-pitch diffraction lobe 408. Further, the defocus introduced by the phase plate 302 provides an in-focus image of the large-pitch grating 204 simultaneously on the detector 128. Similarly, FIG. 5C illustrates the reverse configuration in which the detector 128 is located at a field plane conjugate to the large-pitch grating 204, while the phase plate 302 introduces defocus to the 0-order diffraction lobe 404 and the small-pitch diffraction lobe 408 to simultaneously provide in-focus images of the large-pitch grating 204 and the small-pitch grating 208.

In some embodiments, the overlay metrology sub-system 102 includes two detectors 128 (e.g., in two collection channels) to separately image the large-pitch grating 204 and the small-pitch grating 208. For example, a first collection channel may include one or more blockers (e.g., in a collection pupil plane 132) to block the 0-order diffraction lobe 404 small-pitch diffraction lobe 408. In this way, a detector 128 in this channel may generate a dark-field image of the large-pitch grating 204 based solely on the large-pitch diffraction lobes 406. Similarly, a second collection channel may include one or more blockers (e.g., in a collection pupil plane 132) to block the large-pitch diffraction lobes 406 to generate an image of the small-pitch grating 208 based solely on the 0-order diffraction lobe 404 and the small-pitch diffraction lobe 408.

Figure 6A:
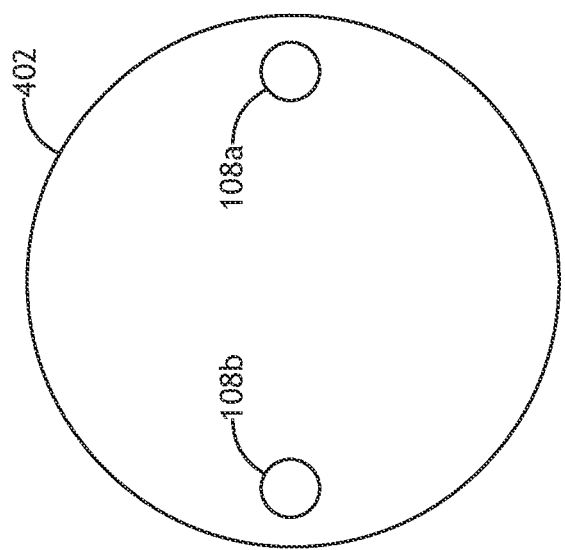
FIG. 6A is a top view of an illumination pupil plane providing two illumination beams at symmetrically-opposed azimuth incidence angles, in accordance with one or more embodiments of the present disclosure.
Figure 6C:
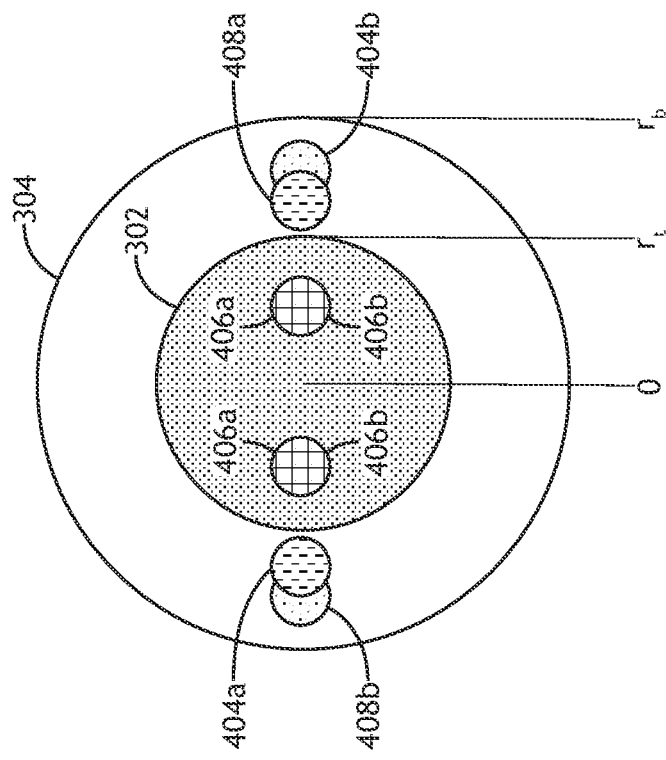
FIG. 6C is a top view of a collection pupil plane configured for imaging based on oblique illumination with two illumination beams as illustrated in FIG. 6A in a generalized configuration and having a phase plate configured as illustrated in FIG. 3A, in accordance with one or more embodiments of the present disclosure.
Figure 6B:
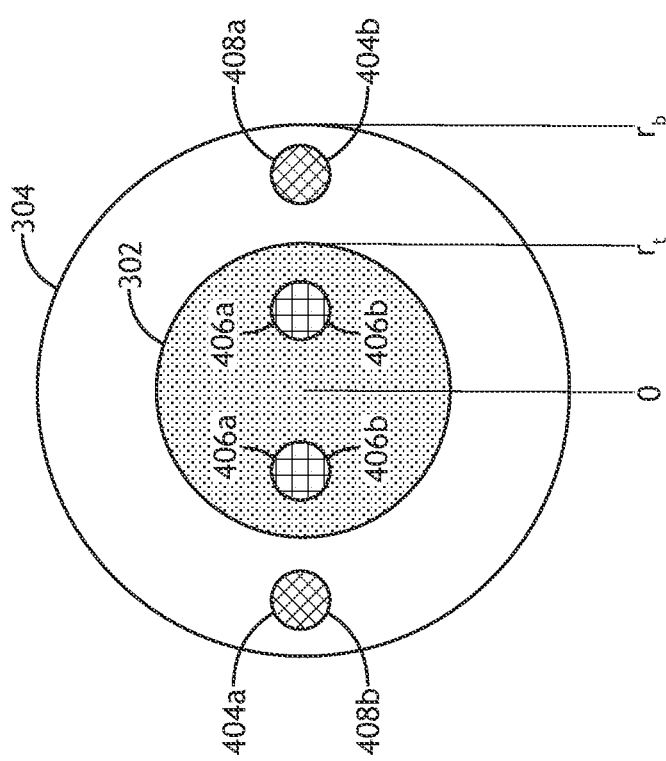
FIG. 6B is a top view of a collection pupil plane configured for imaging based on oblique illumination with two illumination beams as illustrated in FIG. 6A in a Littrow configuration and having a phase plate configured as illustrated in FIG. 3A, in accordance with one or more embodiments of the present disclosure.

Referring now to FIGS. 6A-6C, in some embodiments, the overlay metrology sub-system 102 generates an overlay measurement based on illumination of an overlay target 106 with two or more illumination beams 108. The two or more illumination beams 108 may be provided either simultaneously or sequentially. Further, multiple illumination beams 108 may be utilized for a measurement along a particular direction (e.g., a measurement along the X direction in FIG. 2B) or may be utilized for measurements along multiple directions.

FIG. 6A is a top view of an illumination pupil plane 120 providing two illumination beams 108$a,b$ at symmetrically-opposed azimuth incidence angles, in accordance with one or more embodiments of the present disclosure. Illumination with symmetrically-opposed azimuth incidence angles may mitigate the impact of asymmetries of the features of the overlay target 106 and/or profiles of the illumination beams 108. Further, the two illumination beams 108 may be directed to the overlay target 106 either simultaneously or sequentially to facilitate simultaneous or sequential imaging. However, it is to be understood that the overlay metrology sub-system 102 may illuminate the overlay target 106 with any number of illumination beams 108 with any azimuth incidence angles.

FIG. 6B is a top view of a collection pupil plane 132 configured for imaging based on oblique illumination with two illumination beams 108 as illustrated in FIG. 6A in a Littrow condition and having a phase plate 302 configured as illustrated in FIG. 3A, in accordance with one or more embodiments of the present disclosure. For example, FIG. 6B depicts the following diffraction lobes associated with diffraction of the illumination beam 108$a$, all of which correspond to the diffraction lobes depicted in FIG. 5B: a 0-order diffraction lobe 404$a$, first and second order large-pitch diffraction lobes 406$a$, and a first order small-pitch diffraction lobe 408$a$. FIG. 6B further depicts the following diffraction lobes associated with diffraction of the illumination beam 108$b$: a 0-order diffraction lobe 404$b$, first and second order large-pitch diffraction lobes 406$b$, and a first order small-pitch diffraction lobe 408$b$. These diffraction lobes follow a similar pattern as illustrated in FIG. 5B, but are oriented in an opposite order along the X direction based on the incidence angle of the illumination beam 108$b$. Further, since the illumination beams 108$a,b$ and the small-pitch grating 208 are arranged in a Littrow configuration (e.g., according to a metrology recipe), the pattern of diffraction lobes of the illumination beams 108$a,b$ overlap in the collection pupil plane 132.

In a manner similar to the description of FIGS. 5A-5C, in some embodiments, the overlay metrology sub-system 102 includes two detectors 128 (e.g., in two collection channels) to separately image the large-pitch grating 204 and the small-pitch grating 208. For example, a first collection channel may include one or more blockers (e.g., in a collection pupil plane 132) to block the 0-order diffraction lobes 404$a$-$b$ as well as the small-pitch diffraction lobes 408$a$-$b$. In this way, a detector 128 in this channel may generate a dark-field image of the large-pitch grating 204 based solely on the large-pitch diffraction lobes 406$a$-$b$. Similarly, a second collection channel may include one or more blockers (e.g., in a collection pupil plane 132) to block the large-pitch diffraction lobes 406a-b to generate an image of the small-pitch grating 208 based solely on the 0-order diffraction lobes 404a-b and the small-pitch diffraction lobes 408a-b.

Referring generally to FIGS. 3A-6B, it is to be understood that FIGS. 3A-6B and the associated descriptions are provided solely for illustrative purposes and should not be interpreted as limiting on the present disclosure. For example, the overlay metrology sub-system 102 may illuminate an overlay target 106 with any number of illumination beams 108 at any combination of altitude or azimuth incidence angles.

As an illustration, FIG. 6C is a top view of a collection pupil plane 132 configured for imaging based on oblique illumination with two illumination beams 108 as illustrated in FIG. 6A in a generalized configuration and having a phase plate 302 configured as illustrated in FIG. 3A, in accordance with one or more embodiments of the present disclosure. In particular, FIG. 6C corresponds to a variation of FIG. 6B in which the illumination beams 108a,b and the small-pitch grating 208 are not in a Littrow configuration, but still provide that the diffraction orders from the large-pitch grating 204 and the small-pitch grating 208 lie within different radial bands in the collection pupil plane 132 to facilitate simultaneous imaging based on a radially-varying defocus distribution as disclosed herein.

As another illustration, although not shown, illumination with the illumination beams 108a,b may also be utilized with additional configurations of the overlay metrology sub-system 102 including, but not limited to, an annular phase plate 302 as depicted in FIG. 3B or an objective lens 138 with an adjustable spherical aberration as disclosed previously herein.

As another illustration, although not shown, the overlay metrology sub-system 102 may illuminate an overlay target 106 with illumination beams 108 oriented along different azimuth directions (e.g., X and Y directions) to facilitate simultaneous imaging of target features with periodicities along different directions (e.g., as depicted in FIG. 2B).

Figure 1C:
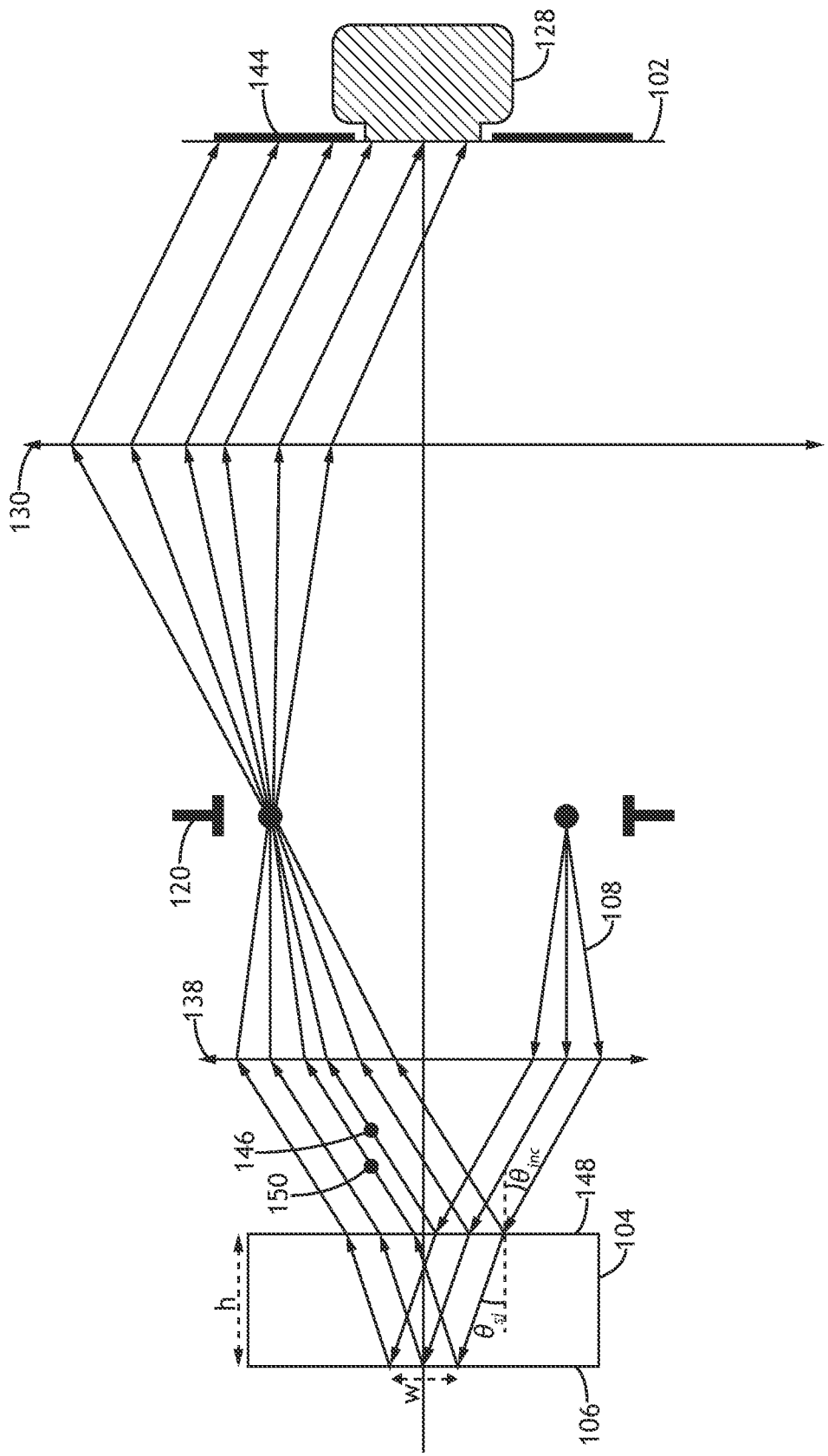
FIG. 1C is a conceptual view of a portion of the overlay metrology sub-system illustrating a collection field stop for blocking the zero-order reflections from the top surface of the sample, in accordance with one or more embodiments of the present disclosure.

Referring now to FIGS. 1C and 1D, it is contemplated herein that reflections from a top surface of a sample 104 may reduce a contrast of images of the overlay target 106, particularly in the case of oblique illumination.

In some embodiments, the overlay metrology sub-system 102 includes an illumination collection field stop sized to match the overlay target 106 (e.g., a cell 202 thereon) or field of view of the detector 128. For example, such a field stop may be configured as a confocal field stop that is sized to match the overlay target 106 and/or a field of view of the detector 128. FIG. 1C is a conceptual view of a portion of the overlay metrology sub-system 102 illustrating a field stop for blocking the zero-order reflections from the top surface of the sample 104, in accordance with one or more embodiments of the present disclosure. In FIG. 1C, an image of the field stop 144 at a plane of the detector 128.

In particular, FIG. 1C illustrates an objective lens 138 and the pupil plane 142 (e.g., a back focal plane of the objective lens 138) that is common to both the illumination pathway 116 (not shown) and the collection pathway 126. FIG. 1C further depicts illumination with a single oblique illumination beam 108 emanating from the pupil plane 142 for the purposes of clarity, but it is to be understood that the illumination beam 108 may be provided to the pupil plane 142 via an illumination pathway 116 as depicted in FIG. 1B.

An illumination beam 108 incident on a sample 104 at an oblique angle ($\theta_{inc}$) may result in various zero-order reflected beams including, but not limited to, a top surface reflected beam 146 associated with a reflection of the illumination beam 108 by a top surface 148 of the sample 104, and a buried feature reflected beam 150 associated with a reflection of the illumination beam 108 by buried features of the overlay target 106. These beams may each have a width (w), which may be controlled by an illumination field stop or by any other suitable technique. As illustrated in FIG. 1C, these beams may be spatially separated under certain conditions related to the incidence angle ($\theta_{inc}$), the width (w) of the illumination beam 108, and a depth of the buried feature (h) within the sample 104. In particular, the reflected beams overlap (e.g., dazzling begins) under the following conditions:

$$\tan \theta_{inc} = \frac{w}{2h}. \quad (1)$$

This condition can also be written based on Snell's law in the sample 104 as:

$$NA_{min,obsc} = \frac{n_s}{\sqrt{\frac{4h^2}{w^2}+1}}. \quad (2)$$

where $n_s$ is the refractive index of the sample 104 and $NA_{min,obsc}$ is a minimum numerical aperture (NA) that the illumination beam 108 may have to avoid dazzling.

Provided that the reflected beams do not overlap (e.g., no dazzling occurs), the top surface reflected beam 146 may be filtered using a collection field stop. In FIG. 1C, this is illustrated as the top surface reflected beam 146 falling outside the field of a detector 128. However, it is to be understood that the overlay metrology sub-system 102 may also include a collection field stop in a relayed field plane in the collection pathway 126 to filter the top surface reflected beam 146 prior to the detector 128.

As an illustration considering target features buried 270 microns below a surface of a silicon sample 104 (e.g., $n_s$=3.5) and a 50 micrometer wide illumination beam 108 (e.g., w=50 µm), a minimum NA of the illumination beam 108 ($NA_{min,obsc}$) is 0.323, which may be achieved with oblique illumination as disclosed herein.

The overlay metrology sub-system 102 may further be configured (e.g., according to a metrology recipe) to provide tailored illumination and/or collection of features on each layer of the overlay target 106. For example, the overlay metrology sub-system 102 may illuminate the overlay target 106 with multiple illumination beams 108, where different illumination beams 108 and/or associated components of the collection pathway 126 are tailored for each layer.

In some embodiments, the overlay metrology sub-system 102 provides two illumination beams 108 with common incidence angles (e.g., having overlapping locations in an illumination pupil plane 120), but where the two illumination beams 108 have different beam widths (w) selected to prevent dazzling between corresponding top surface reflected beams 146 and buried feature reflected beams 150 for features at different depths. For example, a first illumination beam 108 may have a first width (w) selected to prevent dazzling between a top surface reflected beam 146 and a buried feature reflected beam 150 at a first depth (h) associated with a first layer 206 of the overlay target 106, while a second illumination beam 108 may have a second width (w) selected to prevent dazzling between a top surface reflected beam 146 and a buried feature reflected beam 150 at a second depth (not illustrated). Further, the collection pathway 126 may include one or more field stops tailored to block the top surface reflected beams 146 associated with each of the illumination beams 108.

Multiple illumination beams 108 with overlapping incidence angles but different beam widths (w) may be generated using any technique known in the art. For example, the illumination pathway 116 may provide two illumination beams 108 in two arms including illumination field stops having different widths (w) and may further include a beam combiner to overlap the two illumination beams 108 at a common illumination pupil plane 120.

It is contemplated herein that an overlay target 106 may have features (e.g., the large-pitch grating 204 or the small-pitch grating 208) on any layer or any depth (h). In a configuration in which the overlay target 106 includes features (e.g., a large-pitch grating 204 or a small-pitch grating 208) on a top surface 148 of the sample 104 (e.g., h=0), an unwanted zero-order reflection may be mitigated (e.g., greyed out) using an interferometer such as, but not limited to, a Linnik interferometer having a reference beam tuned to an opposite phase as an undesired top surface reflected beam 146.

FIG. 1D is a conceptual view of an overlay metrology sub-system 102 including a Linnik interferometer, in accordance with one or more embodiments of the present disclosure.

In one embodiment, the overlay metrology sub-system 102 includes a reference objective lens 152 configured to receive a portion of an illumination beam 108 through a beamsplitter 140, direct this portion of the illumination beam 108 to a reference sample 154, and collect light reflected from this reference sample 154. In this regard, the objective lens 138 and the sample 104 may form a measurement arm 156 of a Linnik interferometer, while the reference objective lens 152 and the reference sample 154 may form a reference arm 158 of the Linnik interferometer.

The reference sample 154 may include any sample suitable for providing reference light in the Linnik interferometer. For example, the reference sample 154 may be designed to at least partially replicate the sample 104. In this regard, the Linnik interferometer may be balanced and the optical properties of light propagating through the reference sample 154 may be the same as or substantially similar to those of light propagating through the sample 104.

In some embodiments, the Linnik interferometer further includes a phase adjuster 160 configured to provide that a phase of a top surface reflected beam 146 from the sample 104 may have an opposite phase of a corresponding top surface reflected beam 162 from the reference sample 154. In this way, the top surface reflected beam 146 from the sample 104 and the top surface reflected beam 162 from the reference sample 154 may negatively interfere on the detector 128. Further, the phase adjuster 160 may include any combination of one or more optical components suitable for adjusting an optical phase of light such as, but not limited to, a wedge or a waveplate.

It is to be understood that FIG. 1D and the associated description of a Linnik interferometer is provided solely for illustrative purposes and should not be interpreted as limiting. Rather, the overlay metrology sub-system 102 may include any type of interferometer known in the art to mitigate an unwanted top surface reflected beam 146 from target features on a top surface 148 of a sample 104.

Referring again generally to FIGS. 1A-1D, various additional aspects of the overlay metrology sub-system 102 are described in greater detail, in accordance with one or more embodiments of the present disclosure.

The illumination source 114 may include any type of light source known in the art. In one embodiment, the illumination source 114 includes one or more coherent sources such as, but not limited to, one or more laser sources. In this regard, the illumination source 114 may produce an illumination beam 108 having high coherence (e.g., high spatial coherence and/or temporal coherence). For example, the illumination source 114 may include one or more broadband lasers such as, but not limited to, one or more supercontinuum lasers or white-light lasers. By way of another example, the illumination source 114 may include one or more narrowband lasers. By way of a further example, the illumination source 114 may include one or more tunable lasers to provide an illumination beam 108 having tunable spectral intensity. Further, a coherent illumination source 114 may be based on any type of technology or product design. For example, the illumination source 114 may include, but is not limited to, any combination of one or more fiber lasers, one or more diode lasers, or one or more gas lasers.

In another embodiment, the illumination source 114 includes one or more sources to provide an illumination beam 108 having low or partial coherence (e.g., spatial and/or temporal coherence). For example, the illumination source 114 may include one or more light emitting diodes (LEDs) or superluminescent LEDs. By way of another example, the illumination source 114 may include a laser-sustained plasma (LSP) source such as, but not limited to, an LSP lamp, an LSP bulb, or an LSP chamber suitable for containing one or more elements that, when excited by a laser source into a plasma state, may emit broadband illumination. By way of another example, the illumination source 114 may include a lamp source such as, but not limited to, an arc lamp, a discharge lamp, an electrode-less lamp, or the like.

The illumination source 114 may provide an illumination beam 108 having any selected wavelength or range of wavelengths (e.g., spectrum). It is contemplated herein that the spectrum of the illumination beam 108 may be selected to transmit through at least a portion of the sample 104 to reach features on the overlay target 106 in sub-surface layers with minimal or at least acceptable absorption. For example, in the case of a sample 104 formed as two bonded semiconductor substrates, the spectrum of the illumination beam 108 may be selected to include wavelengths in the infrared spectral range. However, it is to be understood that the systems and methods disclosed herein may be broadly applicable to a wide range of samples such that the illumination beam 108 may have any selected spectrum based on the composition of the sample 104.

The illumination source 114 may further provide light having any selected temporal characteristics. In some embodiments, the illumination source 114 includes one or more continuous-wave sources to provide a continuous-wave illumination beam 108. In some embodiments, the illumination source 114 includes one or more pulsed sources to provide a pulsed or otherwise modulated illumination beam 108. For example, the illumination source 114 may include one or more mode-locked lasers, one or more Q-switched lasers, or the like. It is contemplated herein that illumination with a pulsed laser source may provide high-throughput measurements in static or scanning modes of operation.

It is contemplated herein that an illumination source 114 providing pulsed laser illumination beam 108 may provide various benefits for the measurement of a tall overlay target 106 as disclosed herein.

For example, a pulsed laser illumination beam 108 may provide relatively high peak powers suitable for overlay measurements coupled with a relatively low NA. It is contemplated herein that reducing a NA of an illumination beam 108 may generally ease the requirements of a radially-varying defocus distribution as disclosed herein. In particular, the sizes of the diffraction lobes in the collection pupil plane 132 is based on the NA of the illumination beam 108. Accordingly, reducing the NA of the illumination beam 108 relaxes the requirements for separation of the associated diffraction lobes into different radial bands of the collection pupil plane 132 (e.g., a required difference in pitch between the large-pitch grating 204 and the small-pitch grating 208, or the like). In the case of a step-wise radially-varying defocus distribution, reducing the NA of an illumination beam 108 may relax the width and/or radius requirements of a phase plate 302 providing the radially-varying defocus distribution. In the case of a continually-varying defocus distribution (e.g., as provided by an objective lens 138 with an adjustable spherical aberration, or the like), reducing the NA of an illumination beam 108 may reduce an impact of a spatially-varying defocus across the beam profile of collected diffraction orders.

As another example, a pulsed laser illumination beam 108 may facilitate high-throughput measurements in a scanning operational mode. As a non-limiting illustration, an illumination beam 108 with pulses on the order of 1 nanosecond may be suitable for sampling with approximately 250 measurements per second. In a general sense however, an illumination beam 108 may have any suitable pulse duration and/or repetition rate. In this way, an illumination beam 108 may have, but is not limited to, a pulse duration on the order microseconds, nanoseconds, picoseconds, or femtoseconds. Further, an illumination beam 108 may have, but is not limited to, a repetition rate on the order of KHz, MHz, or GHz.

The sample positioning sub-system 112 may include any components suitable for translating the sample 104 relative to an illumination beam 108 and/or translating the illumination beam 108 relative to the sample 104. For example, the sample positioning sub-system 112 may include at least one translation stage 164 to adjust the position of the sample 104 along any dimension such as, but not limited to, a lateral position within the X-Y plane, axially along the Z axis (e.g., an optical axis of the objective lens 138), tip, tilt, or the like. As another example, though not shown, the sample positioning sub-system 112 may include one or more beam-scanning optical elements (not shown) suitable for scanning an illumination beam 108 across the sample 104 such as, but not limited to, galvanometers or rotatable mirrors.

In some embodiments, the overlay metrology system 100 includes a controller 166. The controller 166 may include one or more processors 168 configured to execute program instructions maintained on memory 170, or memory medium. In this regard, the one or more processors 168 of controller 166 may execute any of the various process steps described throughout the present disclosure. Further, the controller 166 may be communicatively coupled to the overlay metrology sub-system 102 or any component therein.

The one or more processors 168 of a controller 166 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 168 may include any device configured to execute algorithms and/or instructions (e.g., program instructions stored in memory). In one embodiment, the one or more processors 168 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 166 or, alternatively, multiple controllers. Additionally, the controller 166 may include one or more controllers housed in a common housing or within multiple housings. In this way, any controller or combination of controllers may be separately packaged as a module suitable for integration into the overlay metrology system 100.

The memory 170 may include any storage medium known in the art suitable for storing program instructions executable by the associated one or more processors 168. For example, the memory 170 may include a non-transitory memory medium. By way of another example, the memory 170 may include, but is not limited to, a read-only memory (ROM), a random-access memory (RAM), a magnetic or optical memory device (e.g., disk), a magnetic tape, a solid-state drive and the like. It is further noted that memory 170 may be housed in a common controller housing with the one or more processors 168. In one embodiment, the memory 170 may be located remotely with respect to the physical location of the one or more processors 168 and controller 166. For instance, the one or more processors 168 of controller 166 may access a remote memory (e.g., server), accessible through a network (e.g., internet, intranet and the like).

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the methods described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system, comprising:
an objective lens;
one or more illumination optics configured to direct illumination from an illumination source to an overlay target on a sample through the objective lens when implementing a metrology recipe, wherein the overlay target in accordance with the metrology recipe includes a first grating with a first pitch on a first sample layer and a second grating with a second pitch on a second sample layer, wherein the second pitch is smaller than the first pitch, wherein the first and second sample layers are separated by a layer separation distance greater than a depth of field of the objective lens;
a detector; and
one or more collection optics configured to direct at least a portion of light collected by the objective lens to the detector, wherein the metrology recipe provides that diffraction orders of the illumination by the first grating collected by the objective lens are positioned below a threshold radius in a pupil plane and diffraction orders of the illumination by the second grating collected by the objective lens are positioned above the threshold radius in the pupil plane, wherein the one or more collection optics provide a radially-varying defocus distribution to compensate for the layer separation distance, wherein the first and second gratings are simultaneously in focus on the detector; and a controller including one or more processors configured to execute program instructions causing the one or more processors to execute the metrology recipe by:
receiving one or more images of the overlay target from the detector in which the first and second gratings are simultaneously in focus on the detector; and
determining an overlay measurement between the first and second layers of the sample based on the one or more images.

2. The overlay metrology system of claim 1, wherein the one or more collection optics includes a phase plate in the pupil plane having a radius equal to the threshold radius to provide the radially-varying defocus distribution, wherein the phase plate introduces a phase delay to the diffraction orders of the illumination by the first grating to compensate for the layer separation distance.

3. The overlay metrology system of claim 1, wherein the one or more collection optics includes a lens in the pupil plane having a radius equal to the threshold radius to provide the radially-varying defocus distribution, wherein a focal power of the lens compensates for the layer separation distance by adjusting a focal position of the diffraction orders of the illumination by the first grating to match a focal position of the diffraction orders of the illumination by the second grating outside the lens.

4. The overlay metrology system of claim 1, wherein the one or more collection optics includes an objective lens with one or more adjustable optics to provide an adjustable spherical aberration as the radially-varying defocus distribution.

5. The overlay metrology system of claim 4, wherein the one or more adjustable optics of the objective lens providing the adjustable spherical aberration as the radially-varying defocus distribution comprise:
a correction collar.

6. The overlay metrology system of claim 1, wherein the illumination from the illumination source is pulsed.

7. The overlay metrology system of claim 1, further comprising:
at least one of a translation stage or one or more beam-scanning optics to translate relative positions of the sample and the illumination during a measurement.

8. The overlay metrology system of claim 1, wherein the first and second gratings are located in overlapping regions of the sample in accordance with the metrology recipe.

9. The overlay metrology system of claim 1, wherein the first and second gratings are located in non-overlapping regions of the sample in accordance with the metrology recipe.

10. The overlay metrology system of claim 1, wherein the layer separation distance is greater than 10 micrometers.

11. The overlay metrology system of claim 1, wherein the layer separation distance is greater than 100 micrometers.

12. The overlay metrology system of claim 1, wherein the first sample layer is closer to the objective lens than the second sample layer in accordance with the metrology recipe.

13. The overlay metrology system of claim 1, wherein the second sample layer is closer to the objective lens than the first sample layer in accordance with the metrology recipe.

14. The overlay metrology system of claim 1, wherein the sample includes a first substrate bonded to a second substrate in accordance with the metrology recipe, wherein the first grating is located on the first substrate, wherein the second grating is located on the second substrate.

15. The overlay metrology system of claim 1, wherein the sample includes a die bonded to a substrate in accordance with the metrology recipe, wherein the first grating is located on the die, wherein the second grating is located on the substrate.

16. The overlay metrology system of claim 1, wherein the sample includes a die bonded to a substrate in accordance with the metrology recipe, wherein the first grating is located on the die, wherein the second grating is located on the scribe line.

17. The overlay metrology system of claim 1, wherein the metrology recipe provides that the one or more illumination optics direct the illumination from the illumination source at a normal incidence angle, wherein +/−1 order diffraction lobes from the first grating are positioned below the threshold radius in the pupil plane, wherein +/−1 order diffraction lobes from the second grating are positioned above the threshold radius in the pupil plane.

18. The overlay metrology system of claim 17, wherein the one or more collection optics further includes one or more elements to block zero order diffraction of the illumination from reaching the detector.

19. The overlay metrology system of claim 1, wherein the metrology recipe provides that the one or more illumination optics direct a first illumination beam of the illumination from the illumination source at a first azimuth incidence angle, wherein first and second order diffraction lobes of the first illumination beam from the first grating lie below the threshold radius in the pupil plane, wherein a first order diffraction lobe and a zero order diffraction lobe of the first illumination beam from the second grating are positioned above the threshold radius in the pupil plane.

20. The overlay metrology system of claim 19, further comprising:
an additional detector, wherein the detector receives the first and second order diffraction lobes of the first illumination beam from the first grating, wherein the additional detector receives the first order diffraction lobe and a zero order diffraction lobe of the first illumination beam from the second grating.

21. The overlay metrology system of claim 19, wherein the metrology recipe provides that the one or more illumination optics direct a second illumination beam of the illumination from the illumination source at a first azimuth incidence angle, wherein first and second order diffraction lobes of the second illumination beam from the first grating lie below the threshold radius in the pupil plane, wherein a first order diffraction lobe and a zero order diffraction lobe of the second illumination beam from the second grating are positioned above the threshold radius in the pupil plane.

22. The overlay metrology system of claim 21, further comprising:
an additional detector, wherein the detector receives:
the first and second order diffraction lobes of the first illumination beam from the first grating; and
the first and second order diffraction lobes of the second illumination beam from the first grating;
wherein the additional detector receives:
the first order diffraction lobe and the zero order diffraction lobe of the first illumination beam from the second grating; and the first order diffraction lobe and the zero order diffraction lobe of the first illumination beam from the second grating.

23. The overlay metrology system of claim 21, wherein the first and second azimuth incidence angles satisfy a Littrow condition.

24. The overlay metrology system of claim 21, wherein the first and second azimuth incidence angles are symmetric along a measurement direction.

25. The overlay metrology system of claim 21, wherein the first and second azimuth incidence angles are orthogonal.

26. The overlay metrology system of claim 19, wherein the one or more illumination optics further include a field stop to prevent a reflection of the first illumination beam from a surface of the sample from reaching the detector.

27. The overlay metrology system of claim 19, wherein one of the first grating or the second grating is on a surface of the sample, wherein the one or more collection optics include an interferometer providing a reference beam of an opposite phase as the zero order diffraction lobe to mitigate the zero order diffraction lobe.

28. An overlay metrology system, comprising:
   a controller communicatively coupled to an overlay metrology sub-system, the controller including one or more processors configured to execute program instructions causing the one or more processors to execute a metrology recipe by:
       receiving one or more images of an overlay target from a detector of the overlay metrology sub-system in which the first and second gratings are simultaneously in focus on the detector, wherein the overlay metrology sub-system comprises:
       an objective lens;
       one or more illumination optics configured to direct illumination from an illumination source to the overlay target on a sample through the objective lens when implementing the metrology recipe, wherein the overlay target in accordance with the metrology recipe includes a first grating with a first pitch on a first sample layer and a second grating with a second pitch on a second sample layer, wherein the second pitch is smaller than the first pitch, wherein the first and second sample layers are separated by a layer separation distance greater than a depth of field of the objective lens;
       a detector; and
       one or more collection optics configured to direct at least a portion of light collected by the objective lens to the detector, wherein the metrology recipe provides that diffraction orders of the illumination by the first grating collected by the objective lens are positioned below a threshold radius in a pupil plane and diffraction orders of the illumination by the second grating collected by the objective lens are positioned above the threshold radius in the pupil plane, wherein the one or more collection optics provide a radially-varying defocus distribution to compensate for the layer separation distance, wherein the first and second gratings are simultaneously in focus on the detector; and
       determining an overlay measurement between the first and second layers of the sample based on the one or more images.

29. The overlay metrology system of claim 28, wherein the metrology recipe provides that the one or more illumination optics direct the illumination from the illumination source at a normal incidence angle, wherein +/−1 order diffraction lobes from the first grating are positioned below the threshold radius in the pupil plane, wherein +/−1 order diffraction lobes from the second grating are positioned above the threshold radius in the pupil plane.

30. The overlay metrology system of claim 29, wherein the one or more collection optics further includes one or more elements to block zero order diffraction of the illumination from reaching the detector.

31. The overlay metrology system of claim 28, wherein the metrology recipe provides that the one or more illumination optics direct a first illumination beam of the illumination from the illumination source at a first azimuth incidence angle, wherein first and second order diffraction lobes of the first illumination beam from the first grating lie below the threshold radius in the pupil plane, wherein a first order diffraction lobe and a zero order diffraction lobe of the first illumination beam from the second grating are positioned above the threshold radius in the pupil plane.

32. The overlay metrology system of claim 31, further comprising:
   an additional detector, wherein the detector receives the first and second order diffraction lobes of the first illumination beam from the first grating, wherein the additional detector receives the first order diffraction lobe and a zero order diffraction lobe of the first illumination beam from the second grating.

33. The overlay metrology system of claim 31, wherein the metrology recipe provides that the one or more illumination optics direct a second illumination beam of the illumination from the illumination source at a second azimuth incidence angle, wherein first and second order diffraction lobes of the second illumination beam from the first grating lie below the threshold radius in the pupil plane, wherein a first order diffraction lobe and a zero order diffraction lobe of the second illumination beam from the second grating are positioned above the threshold radius in the pupil plane.

34. The overlay metrology system of claim 33, further comprising:
   an additional detector, wherein the detector receives:
       the first and second order diffraction lobes of the first illumination beam from the first grating; and
       the first and second order diffraction lobes of the second illumination beam from the first grating;
   wherein the additional detector receives:
       the first order diffraction lobe and the zero order diffraction lobe of the first illumination beam from the second grating; and
       the first order diffraction lobe and the zero order diffraction lobe of the first illumination beam from the second grating.

35. The overlay metrology system of claim 33, wherein the first and second azimuth incidence angles satisfy a Littrow condition.

36. The overlay metrology system of claim 28, wherein the illumination from the illumination source is pulsed.

37. The overlay metrology system of claim 28, wherein the overlay metrology sub-system further comprises:
   at least one of a translation stage or one or more beam-scanning optics to translate relative positions of the sample and the illumination during a measurement.

38. An overlay metrology method, comprising:
   receiving one or more images of an overlay target on a sample from a detector of an overlay metrology sub-system, wherein the overlay target in accordance with a metrology recipe includes a first grating with a first pitch on a first sample layer and a second grating with a second pitch on a second sample layer, wherein the second pitch is smaller than the first pitch, wherein the first and second gratings are simultaneously in focus on the detector, wherein the overlay metrology sub-system comprises:
an objective lens;
one or more illumination optics configured to direct illumination from an illumination source to the overlay target on the sample through the objective lens when implementing the metrology recipe, wherein the first and second sample layers are separated by a layer separation distance greater than a depth of field of the objective lens;
a detector; and
one or more collection optics configured to direct at least a portion of light collected by the objective lens to the detector, wherein the metrology recipe provides that diffraction orders of the illumination by the first grating collected by the objective lens are positioned below a threshold radius in a pupil plane and diffraction orders of the illumination by the second grating collected by the objective lens are positioned above the threshold radius in the pupil plane, wherein the one or more collection optics provide a radially-varying defocus distribution to compensate for the layer separation distance, wherein the first and second gratings are simultaneously in focus on the detector; and
determining an overlay measurement between the first and second layers of the sample based on the one or more images.

39. An overlay metrology target, comprising:
a first substrate;
a second substrate bonded to the first substrate;
a first overlay target comprising:
a first grating with a first pitch on one of a first sample layer or a second sample layer;
a second grating with a second pitch on a different one of the first sample layer or the second sample layer than the first grating target, wherein features of the first and second gratings are distributed in a first direction, wherein one of the first or second sample layers corresponds to a scribe line on the second substrate and another of the first or second sample layers corresponds to a layer in a die of the first substrate;
a second overlay target comprising:
a third grating with the first pitch on one of the first sample layer or the second sample layer;
a fourth grating with the second pitch on a different one of the first sample layer or the second sample layer than the third grating target, wherein features of the third and fourth gratings are distributed in a first direction.

40. The overlay target of claim 39, wherein the first and second sample layers are designed in accordance with a metrology recipe to be separated by a layer separation distance greater than a depth of field of an objective lens of a metrology system, wherein the first and second pitches are designed in accordance with the metrology recipe to provide that diffraction orders of illumination by the first and third gratings collected by the objective lens are positioned below a threshold radius in a pupil plane and diffraction orders of the illumination by the second and fourth gratings collected by the objective lens are positioned above the threshold radius in the pupil plane, wherein an overlay measurement associated with the first and second sample layers is determinable based on an image of the first and second overlay targets with the metrology system providing one or more collection optics with a radially-varying defocus distribution to compensate for the layer separation distance such that the first, second, third, and fourth gratings are simultaneously in focus in the image.

* * * * *